US009899077B2

(12) United States Patent
Hsu et al.

(10) Patent No.: US 9,899,077 B2
(45) Date of Patent: Feb. 20, 2018

(54) WRITE ABORT DETECTION FOR MULTI-STATE MEMORIES

(71) Applicant: SANDISK TECHNOLOGIES LLC, Plano, TX (US)

(72) Inventors: Cynthia Hua-Ling Hsu, Milpitas, CA (US); Aaron Lee, Mountain View, CA (US); Abhijeet Manohar, Bangalore (IN); Deepanshu Dutta, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/588,968

(22) Filed: May 8, 2017

(65) Prior Publication Data

US 2017/0243638 A1    Aug. 24, 2017

Related U.S. Application Data

(63) Continuation of application No. 14/860,086, filed on Sep. 21, 2015, now Pat. No. 9,653,154.

(51) Int. Cl.
*G11C 11/56* (2006.01)

(52) U.S. Cl.
CPC ...... *G11C 11/5628* (2013.01); *G11C 11/5642* (2013.01)

(58) Field of Classification Search
CPC .................. G11C 11/5628; G11C 11/5642
See application file for complete search history.

(56) References Cited

U.S. PATENT DOCUMENTS

| 4,139,911 A | 2/1979 | Sciulli et al. |
| 4,218,764 A | 8/1980 | Furuta et al. |

(Continued)

FOREIGN PATENT DOCUMENTS

| EP | 0 791 933 A1 | 8/1997 |
| GB | 2 289 779 A | 11/1995 |

(Continued)

OTHER PUBLICATIONS

Lee et al., "Error Correction Technique for Multivalued MOS Memory," Electronic Letter 27(15): 1321-1323 )Jul. 18, 1991).

(Continued)

*Primary Examiner* — Tri Hoang
(74) *Attorney, Agent, or Firm* — Foley & Lardner LLP

(57) ABSTRACT

Techniques are presented to determine whether a multi-state memory device suffers has a write operation aborted prior to its completion. In an example where all the word lines of a memory block is first programmed to an intermediate level (such as 2 bits per cells) before then being fully written (such as 4 bits per cell), after determining that intermediate programming pass completed, the block is searched using the read level for the highest multi-state to find the last fully programmed word line, after which the next word line is checked with the lowest state's read level to determine whether the full programming had begun on this word line. In an example where each word line is fully written before beginning the next word line of the block, after determining the first erased word line, the preceding word line is checked as the highest state to see if programming completed and, if not, checked at the lowest read level to see if programming began.

20 Claims, 22 Drawing Sheets

(56) References Cited

U.S. PATENT DOCUMENTS

| | | |
|---|---|---|
| 4,253,059 A | 2/1981 | Bell et al. |
| 4,460,982 A | 7/1984 | Gee et al. |
| 4,612,630 A | 9/1986 | Rosier |
| 4,694,454 A | 9/1987 | Matsuura |
| 4,703,196 A | 10/1987 | Arakawa |
| 4,703,453 A | 10/1987 | Shinoda et al. |
| 4,733,394 A | 3/1988 | Giebel |
| 4,763,305 A | 8/1988 | Kuo |
| 4,779,272 A | 10/1988 | Kohda et al. |
| 4,799,195 A | 1/1989 | Iwahashi et al. |
| 4,809,231 A | 2/1989 | Shannon et al. |
| 4,827,450 A | 5/1989 | Kowalski |
| 4,937,787 A | 6/1990 | Kobatake |
| 4,962,322 A | 10/1990 | Chapman |
| 4,964,079 A | 10/1990 | Devin |
| 4,975,883 A | 12/1990 | Baker et al. |
| 4,980,859 A | 12/1990 | Guterman et al. |
| 5,043,940 A | 8/1991 | Harari |
| 5,052,002 A | 9/1991 | Tanagawa |
| 5,065,364 A | 11/1991 | Atwood et al. |
| 5,070,032 A | 12/1991 | Yuan et al. |
| 5,095,344 A | 3/1992 | Harari |
| 5,119,330 A | 6/1992 | Tanagawa |
| 5,122,985 A | 6/1992 | Santin |
| 5,132,928 A | 7/1992 | Hayashikoshi et al. |
| 5,132,935 A | 7/1992 | Ashmore, Jr. |
| 5,151,906 A | 9/1992 | Sawada |
| 5,157,629 A | 10/1992 | Sato et al. |
| 5,172,338 A | 12/1992 | Mehrotra et al. |
| 5,172,339 A | 12/1992 | Noguchi et al. |
| 5,200,922 A | 4/1993 | Rao |
| 5,239,505 A | 8/1993 | Fazio et al. |
| 5,262,984 A | 11/1993 | Noguchi et al. |
| 5,263,032 A | 11/1993 | Porter et al. |
| 5,270,551 A | 12/1993 | Kamimura et al. |
| 5,270,979 A | 12/1993 | Harari et al. |
| 5,278,794 A | 1/1994 | Tanaka et al. |
| 5,313,421 A | 5/1994 | Guterman et al. |
| 5,313,427 A | 5/1994 | Schreck et al. |
| 5,315,541 A | 5/1994 | Harari et al. |
| 5,321,655 A | 6/1994 | Iwahashi et al. |
| 5,327,383 A | 7/1994 | Merchant et al. |
| 5,335,198 A | 8/1994 | Van Buskirk et al. |
| 5,341,334 A | 8/1994 | Maruyama |
| 5,343,063 A | 8/1994 | Yuan et al. |
| 5,347,489 A | 9/1994 | Merchant et al. |
| 5,365,486 A | 11/1994 | Schreck |
| 5,377,147 A | 12/1994 | Merchant et al. |
| 5,394,359 A | 2/1995 | Kowalski |
| 5,404,485 A | 4/1995 | Ban |
| 5,450,363 A | 9/1995 | Christopherson et al. |
| 5,465,236 A | 11/1995 | Naruke |
| 5,475,693 A | 12/1995 | Christopherson et al. |
| 5,504,760 A | 4/1996 | Harari et al. |
| 5,523,972 A | 6/1996 | Rashid et al. |
| 5,532,962 A | 7/1996 | Auclair et al. |
| 5,570,315 A | 10/1996 | Tanaka et al. |
| 5,583,812 A | 12/1996 | Harari |
| 5,621,682 A | 4/1997 | Tanzawa et al. |
| 5,648,934 A | 7/1997 | O'Toole |
| 5,652,720 A | 7/1997 | Aulas et al. |
| 5,657,332 A | 8/1997 | Auclair et al. |
| 5,661,053 A | 8/1997 | Yuan |
| 5,675,537 A | 10/1997 | Bill et al. |
| 5,689,465 A | 11/1997 | Sukegawa et al. |
| 5,699,297 A | 12/1997 | Yamazaki et al. |
| 5,703,506 A | 12/1997 | Shook et al. |
| 5,712,815 A | 1/1998 | Bill et al. |
| 5,715,193 A | 2/1998 | Norman |
| 5,717,632 A | 2/1998 | Richart et al. |
| 5,751,639 A | 5/1998 | Ohsawa |
| 5,761,125 A | 6/1998 | Himeno |
| 5,774,397 A | 6/1998 | Endoh et al. |
| 5,798,968 A | 8/1998 | Lee et al. |
| 5,890,192 A | 3/1999 | Lee et al. |
| 5,905,673 A | 5/1999 | Khan |
| 5,909,449 A | 6/1999 | So et al. |
| 5,930,167 A | 7/1999 | Lee et al. |
| 5,937,425 A | 8/1999 | Ban |
| 5,963,473 A | 10/1999 | Norman |
| 6,046,935 A | 4/2000 | Takeuchi et al. |
| 6,145,051 A | 11/2000 | Estakhri et al. |
| 6,151,246 A | 11/2000 | So et al. |
| 6,199,139 B1 | 3/2001 | Katayama et al. |
| 6,215,697 B1 | 4/2001 | Lu et al. |
| 6,222,762 B1 | 4/2001 | Guterman et al. |
| 6,222,768 B1 | 4/2001 | Hollmer et al. |
| 6,339,546 B1 | 1/2002 | Katayama et al. |
| 6,345,001 B1 | 2/2002 | Mokhlesi |
| 6,415,352 B1 | 7/2002 | Asami et al. |
| 6,426,893 B1 | 7/2002 | Conley et al. |
| 6,522,580 B2 | 2/2003 | Chen et al. |
| 6,546,528 B1 | 4/2003 | Sasaki et al. |
| 6,560,152 B1 | 5/2003 | Cernea |
| 6,567,307 B1 | 5/2003 | Estakhri |
| 6,678,785 B2 | 1/2004 | Lasser |
| 6,728,134 B2 | 4/2004 | Ooishi |
| 6,760,255 B2 | 7/2004 | Conley et al. |
| 6,763,424 B2 | 7/2004 | Conley |
| 6,771,530 B2 | 8/2004 | Kato et al. |
| 6,772,274 B1 | 8/2004 | Estakhri |
| 6,807,101 B2 | 10/2004 | Ooishi et al. |
| 6,839,281 B2 | 1/2005 | Chen et al. |
| 6,912,160 B2 | 6/2005 | Yamada |
| 6,925,007 B2 | 8/2005 | Harari et al. |
| 6,963,505 B2 | 11/2005 | Cohen |
| 7,012,835 B2 | 3/2006 | Gonzalez et al. |
| 7,076,598 B2 | 7/2006 | Wang |
| 7,224,607 B2 | 5/2007 | Gonzalez et al. |
| 7,224,611 B2 | 5/2007 | Yamamoto et al. |
| 7,242,618 B2 | 7/2007 | Shappir et al. |
| 7,254,071 B2 | 8/2007 | Tu et al. |
| 7,257,025 B2 | 8/2007 | Maayan et al. |
| 7,286,412 B1 | 10/2007 | Chen |
| 7,299,314 B2* | 11/2007 | Lin .................. G11C 16/0416 365/185.01 |
| 7,330,376 B1 | 2/2008 | Chen et al. |
| 7,450,425 B2 | 11/2008 | Aritome |
| 7,489,549 B2 | 2/2009 | Mokhlesi |
| 7,518,919 B2 | 4/2009 | Gonzalez et al. |
| 7,613,043 B2 | 11/2009 | Cornwell et al. |
| 7,630,254 B2 | 12/2009 | Lutze |
| 7,631,245 B2 | 12/2009 | Lasser |
| 7,716,538 B2 | 5/2010 | Gonzalez et al. |
| 7,835,209 B2 | 11/2010 | Park et al. |
| 7,843,727 B2 | 11/2010 | Cho et al. |
| 8,014,201 B2 | 9/2011 | Park |
| 8,054,684 B2* | 11/2011 | Gorobets ............ G11C 11/5628 365/185.03 |
| 8,259,506 B1 | 9/2012 | Sommer et al. |
| 8,933,516 B1 | 1/2015 | Wu et al. |
| 9,552,171 B2 | 1/2017 | Huang et al. |
| 2002/0048202 A1 | 4/2002 | Higuchi |
| 2003/0086293 A1 | 5/2003 | Gongwer et al. |
| 2003/0109093 A1 | 6/2003 | Harari et al. |
| 2005/0073884 A1 | 4/2005 | Gonzalez et al. |
| 2005/0231999 A1 | 10/2005 | Moriyama |
| 2006/0039196 A1 | 2/2006 | Gorobets et al. |
| 2006/0062048 A1 | 3/2006 | Gonzalez et al. |
| 2006/0233023 A1 | 10/2006 | Lin et al. |
| 2007/0174740 A1 | 7/2007 | Kanno |
| 2007/0211532 A1 | 9/2007 | Gonzalez et al. |
| 2007/0279989 A1 | 12/2007 | Aritome |
| 2008/0071511 A1 | 3/2008 | Lin |
| 2008/0123420 A1 | 5/2008 | Brandman et al. |
| 2008/0158968 A1 | 7/2008 | Moogat et al. |
| 2008/0158969 A1 | 7/2008 | Moogat et al. |
| 2009/0003058 A1 | 1/2009 | Kang |
| 2009/0187785 A1 | 7/2009 | Gonzalez et al. |
| 2014/0247663 A1 | 9/2014 | Yuan et al. |
| 2015/0089325 A1* | 3/2015 | Chandrasekhar ... G06F 11/1072 714/766 |

(56) References Cited

U.S. PATENT DOCUMENTS

2015/0332770 A1\* 11/2015 Kim .................. G11C 16/0483
　　　　　　　　　　　　　　　　　　　365/185.12

FOREIGN PATENT DOCUMENTS

| JP | 08-077785 | 3/1996 |
| JP | 08-147988 | 6/1996 |
| JP | 08-297295 | 10/1996 |
| JP | 08-297987 | 11/1996 |
| JP | 09-128165 | 5/1997 |
| JP | 09-306182 | 11/1997 |
| JP | 2000-187992 | 4/2000 |
| JP | 2002-318729 | 10/2002 |
| JP | 2003-058432 | 2/2003 |
| WO | WO-90/12400 A1 | 10/1990 |
| WO | WO-01/08015 A1 | 2/2001 |
| WO | WO-01/22232 A1 | 3/2001 |
| WO | WO-02/058074 A2 | 7/2002 |
| WO | WO-2005/036401 A2 | 4/2005 |
| WO | WO-2005/041107 A2 | 5/2005 |
| WO | WO-2011/024015 A1 | 3/2011 |

OTHER PUBLICATIONS

U.S. Notice of Allowance on U.S. Appl. No. 14/860,086 dated Jan. 9, 2017.

\* cited by examiner

|  | WL# | Bias | Bias | Bias |
|---|---|---|---|---|
|  | 64 | VREAD_PARTIAL | VREAD_PARTIAL | VREAD_PARTIAL |
|  | // | VREAD_PARTIAL | VREAD_PARTIAL | VREAD_PARTIAL |
|  | WL_i+2 | VREAD_PARTIAL | VREAD_PARTIAL | VREAD_PARTIAL |
|  | WL_i+1 | VREAD_PARTIAL | VREAD_PARTIAL | VCG_R |
| Last Written WL | WL_i | VREAD_PARTIAL | VREAD_PARTIAL | VREAD |
|  | WL_i-1 | VREAD_PARTIAL | VREAD_PARTIAL | VREAD |
|  | // | VREAD_PARTIAL | VREAD_PARTIAL | VREAD |
|  | WL_n+1 | VREAD_PARTIAL | VREAD_PARTIAL | VREAD |
|  | WL_n | VREAD_PARTIAL | VCG_R | VREAD |
|  | WL_n-1 | VREAD_PARTIAL | VREAD | VREAD |
|  | // | VREAD_PARTIAL | VREAD | VREAD |
|  | 0 | VCG_R | VREAD | VREAD |

FIG. 13

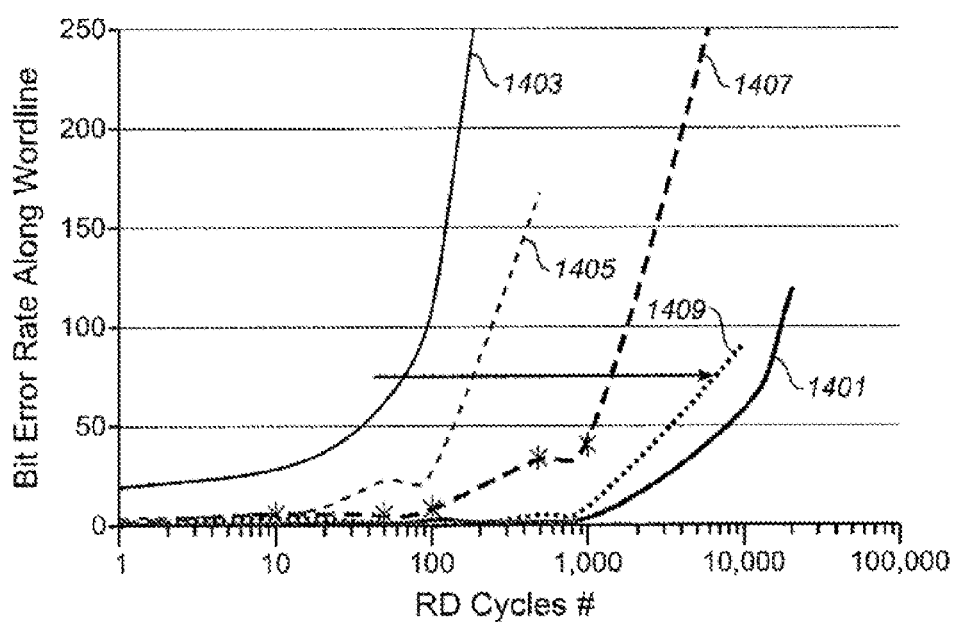

FIG. 14

| WL # | Zone | N=0 | N=1 | N=2 | N=3 |
|---|---|---|---|---|---|
| WLk+31 ⋮ WLk+24 | 4 | VPVD | VPVD | VPVD | VREAD |
| WLk+23 ⋮ WLk+16 | 3 | VPVD | VPVD | VREAD | VREAD |
| WLk+15 ⋮ WLk+8 | 2 | VPVD | VREAD | VREAD | VREAD |
| WLk+7 ⋮ WLk | 1 | VREAD | VREAD | VREAD | VREAD |

*FIG. 24*

WRITE ABORT DETECTION FOR MULTI-STATE MEMORIES

CROSS REFERENCE TO RELATED APPLICATIONS

This application is a continuation of U.S. application Ser. No. 14/860,086, filed on Sep. 21, 2015, the entirety of which is incorporated by reference herein.

BACKGROUND

The following relates to the operation of re-programmable non-volatile memory systems such as semiconductor flash memory that record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. For example, a nonvolatile memory cell may have a trapping dielectric sandwiched between two silicon dioxide layers. Multi-state data storage is implemented by separately reading the binary states of the spatially separated charge storage regions within the dielectric.

SUMMARY

A method of operating a non-volatile memory circuit includes initiating a programming operation on a first block of the non-volatile memory circuit. The non-volatile memory circuit has a plurality of blocks formed according to a NAND type architecture in which memory cells of a block are formed along a plurality of word lines, wherein the memory cells store data in an N-bit per cell, multi-state format in which each word line stores N pages of data, where N is greater than or equal to two, and where the word lines of a block are sequentially written in a write sequence from a first end of the block to a second end thereof with each of the word lines being written from an erased state with N pages of data. The programming operation is aborted prior to completion and, subsequently, a determination of the degree to which the first block was written during the programming operation prior to aborting is performed. The determination includes: searching the first block to determine the first word line in the write sequence that is in the erased state; subsequently performing, for the word line in the write sequence preceding the determined first word line to be in the erased state, a first read operation to determine whether the preceding word line is readable for the most programmed of the multi-states; and in response to the first read operation determining that the preceding word line is not readable for the most programmed of the multi-states, performing for the preceding word line a second read operation for the least programmed of the multi-states above the erased state. Based on the second read operation, it is determined whether programming began on the next word line in the write sequence when the programming operation was aborted.

A method is presented for the operation of a non-volatile memory and includes initiating a programming operation on a first block of the non-volatile memory circuit. The non-volatile memory circuit has a plurality of blocks formed according to a NAND type architecture in which memory cells of a block are formed along a plurality of word lines, wherein the memory cells store data in an N-bit per cell, multi-state format in which each word line stores N pages of data, where N is greater than or equal to two, and where the word lines of a block are sequentially written in a write sequence from a first end of the block to a second end thereof in a first pass in which each of the word lines being written from an erased state with M pages of data, where M is less than N, and are subsequently written from the first end of the block to the second end thereof in a second pass, in which with each of the word lines are further written with (N−M) pages of data. After aborting the programming operation prior to completion, a determination is performed of the degree to which first block was written during the programming operation prior to aborting. The determination includes: determining whether the first pass has completed by performing one or more read operations for the most programmed state of the first pass; in response to determining that the first pass has completed, searching the first block to determine the last word line in the write sequence for the second pass that is readable for the most programmed of the multi-states; and subsequently performing, for the next word line in the write sequence after the determined last word line, a read operation for the least programmed of the multi-states above the erased state. Based on the read operation, it is determining whether programming began on the next word line in the write sequence when the programming operation was aborted.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 13 illustrates using a lowered VREAD_PARTIAL on the drain side of the selected word line when searching for the last written word line of a block.

FIG. 14 shows the use of the lower VREAD_PARTIAL to help to reduce the disturb accumulated on drain side erased word lines, thereby reducing bit error rates.

FIG. 24 illustrates the bias levels applied to word lines in the coarse search.

DETAILED DESCRIPTION

Memory System

Figure 1:
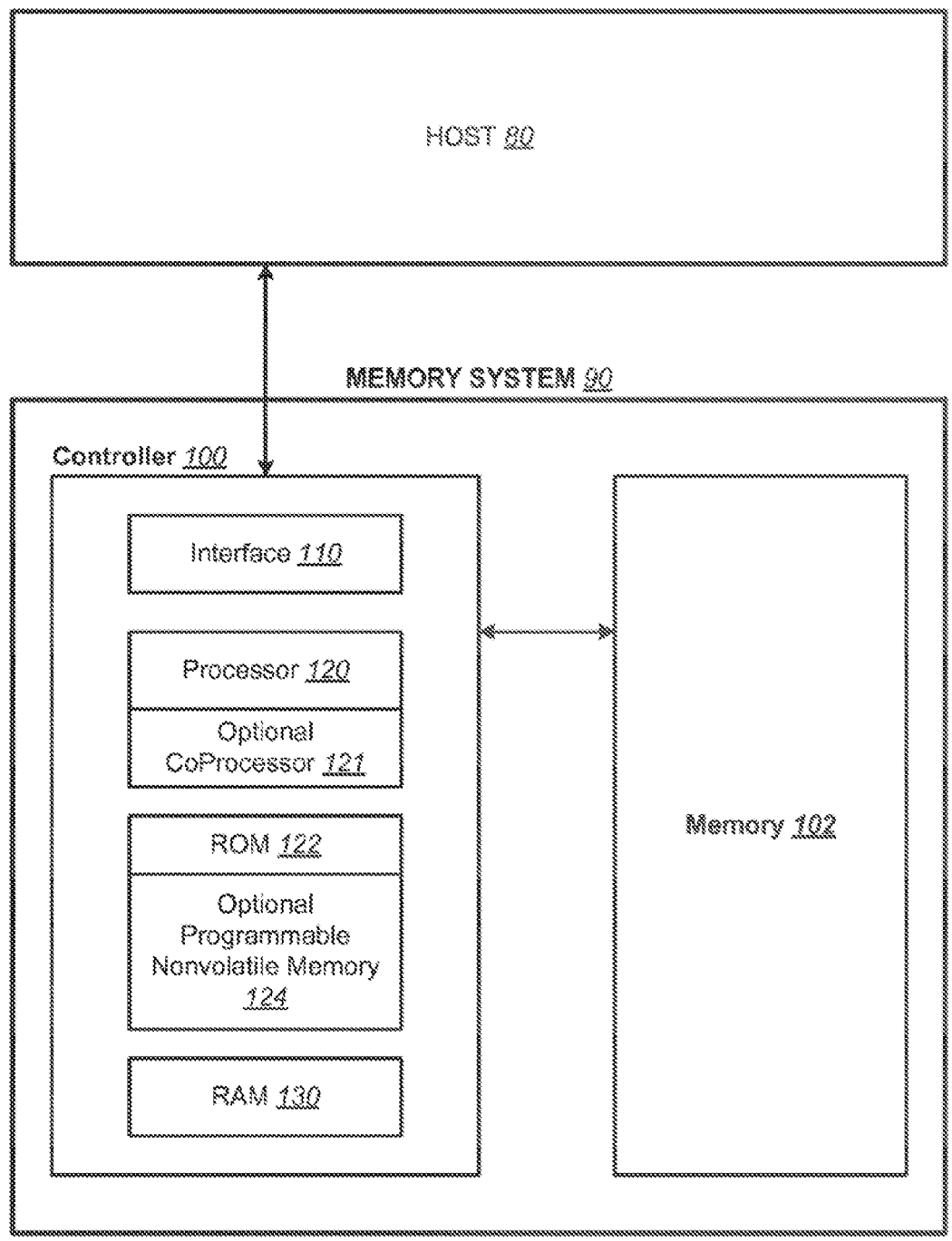
FIG. 1 illustrates schematically the main hardware components of a memory system suitable for implementing various aspects described in the following.

FIG. 1 illustrates schematically the main hardware components of a memory system suitable for implementing the following. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Figure 2:
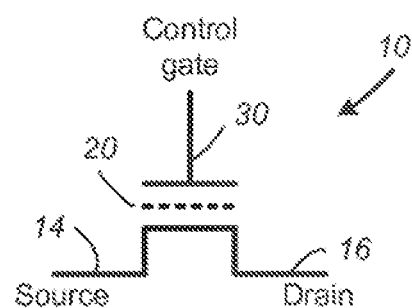
FIG. 2 illustrates schematically a non-volatile memory cell.

It will be recognized that the following is not limited to the two dimensional and three dimensional exemplary structures described but cover all relevant memory structures within the spirit and scope as described herein Physical Memory Structure FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Also, examples of memory devices utilizing dielectric storage elements.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
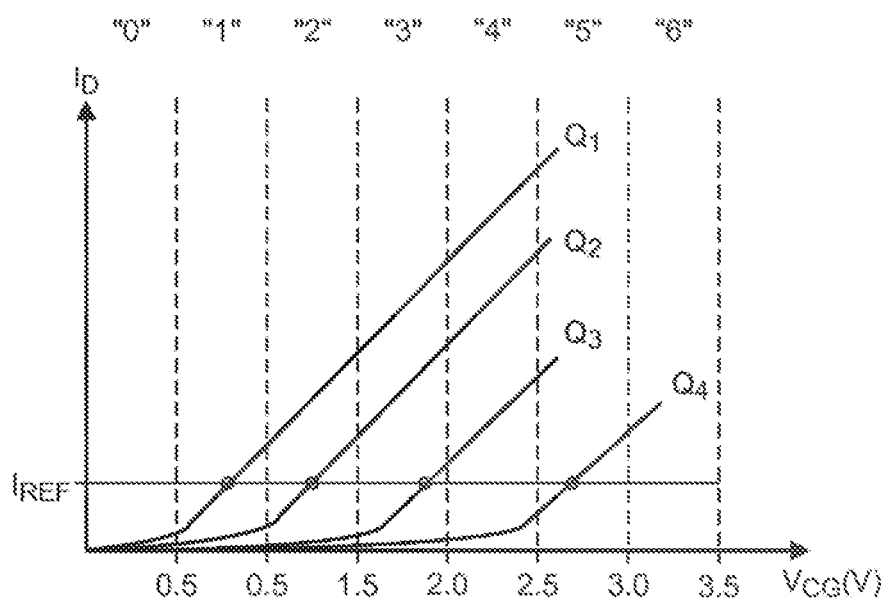
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4:
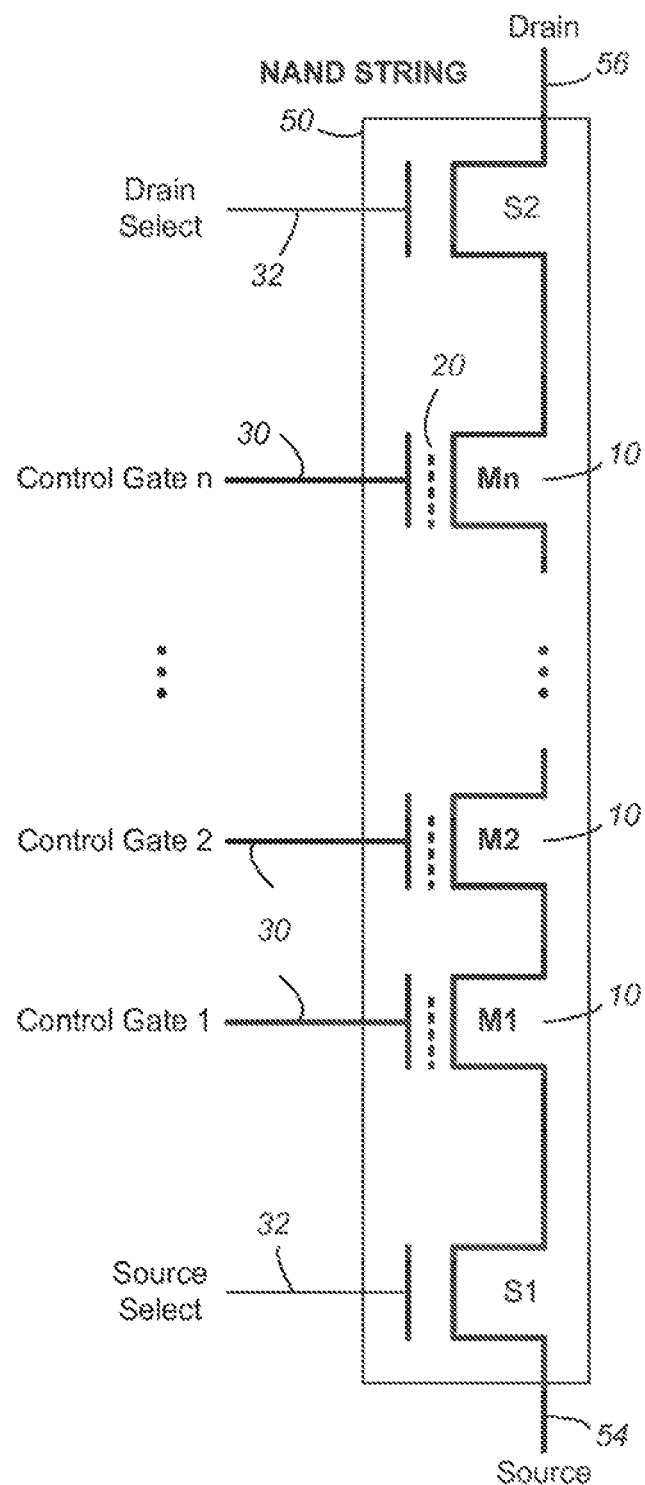
FIG. 4 illustrates schematically a string of memory cells organized into a NAND string.

FIG. 4 illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 5). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 5:
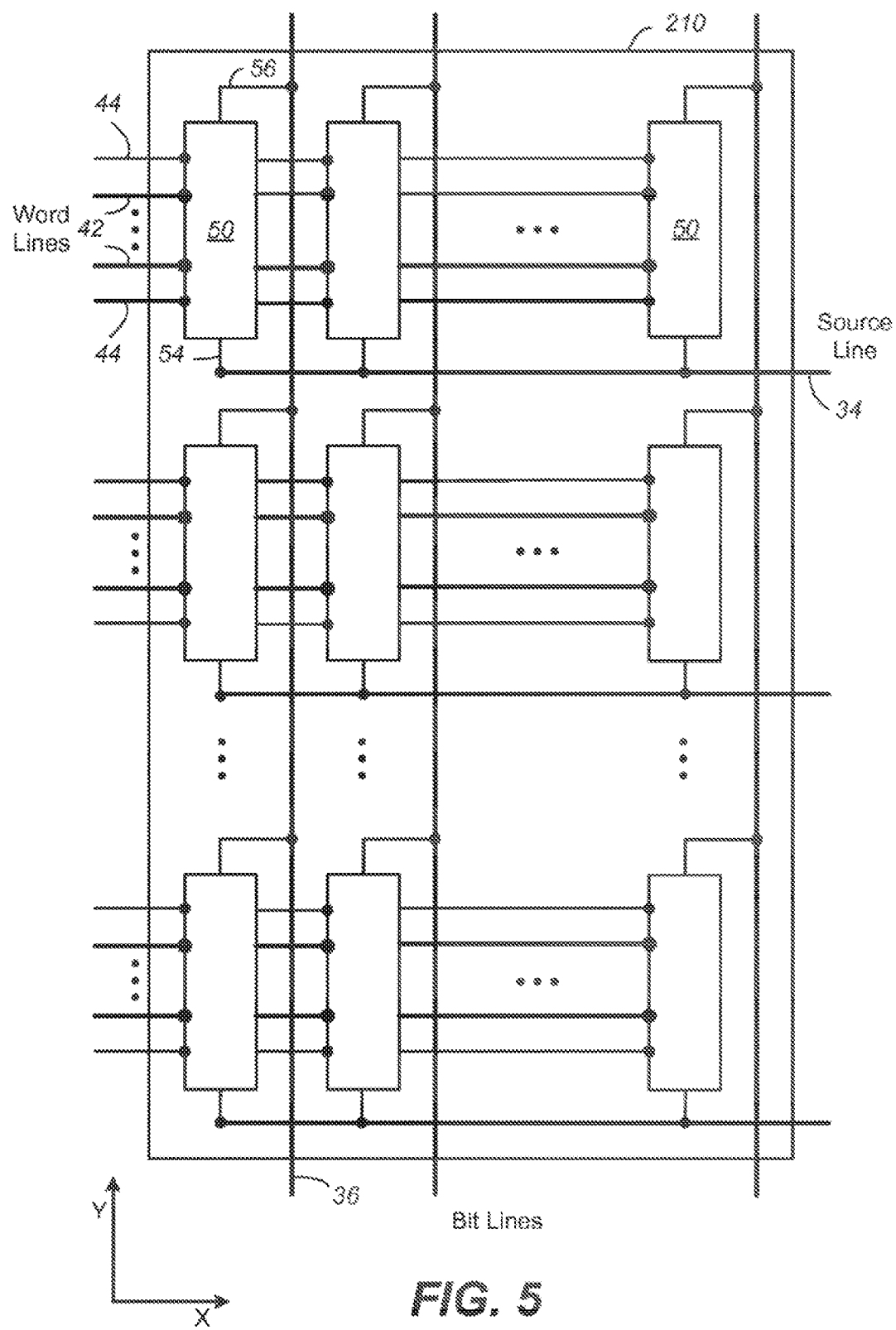
FIG. 5 illustrates an example of a NAND array 210 of memory cells, constituted from NAND strings 50 such as that shown in FIG. 4.

FIG. 5 illustrates an example of a NAND array 210 of memory cells, constituted from NAND strings 50 such as that shown in FIG. 4. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 6:
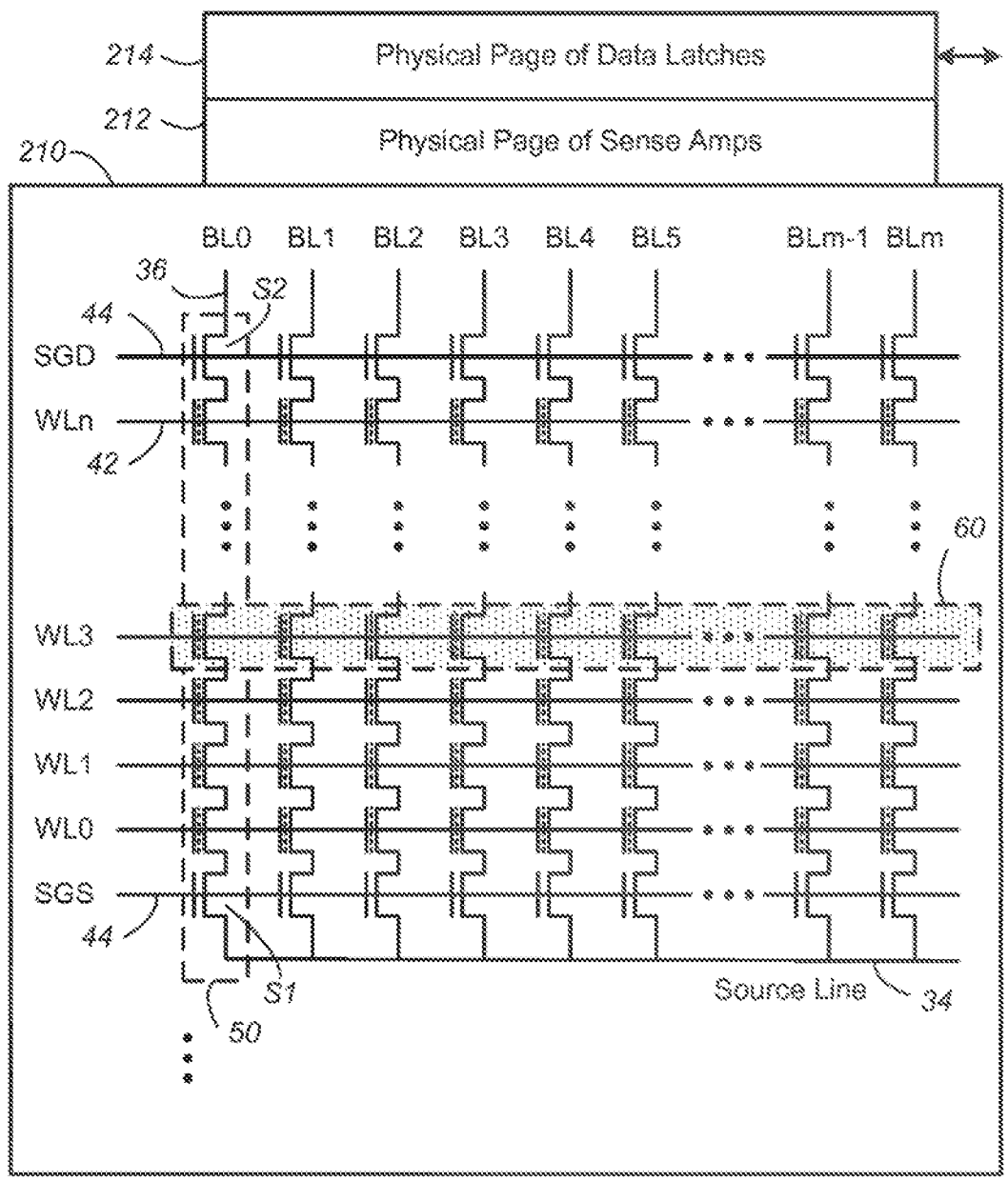
FIG. 6 illustrates a page of memory cells, organized in the NAND configuration, being sensed or programmed in parallel.

FIG. 6 illustrates a page of memory cells, organized in the NAND configuration, being sensed or programmed in parallel. FIG. 6 essentially shows a bank of NAND strings 50 in the memory array 210 of FIG. 5, where the detail of each NAND string is shown explicitly as in FIG. 4. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 7:
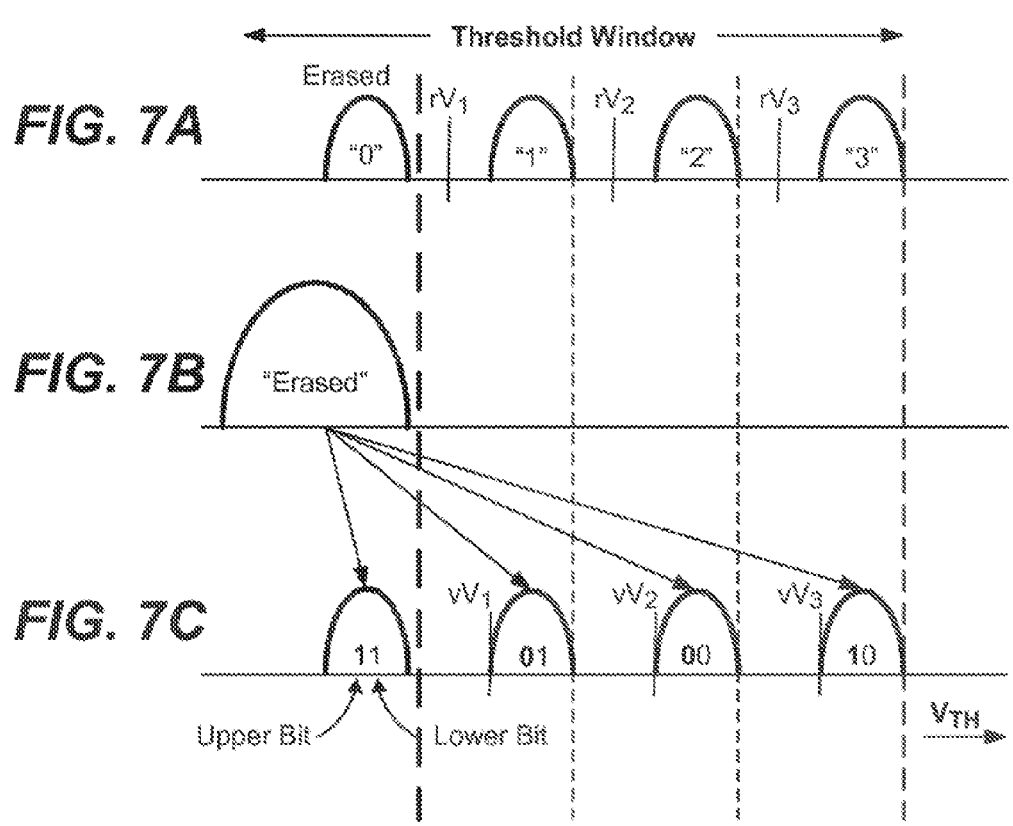
FIGS. 7A-7C illustrate an example of programming a population of memory cells.

FIG. 7A-7C illustrate an example of programming a population of 4-state memory cells. FIG. 7A illustrates the population of memory cells programmable into four distinct distributions of threshold voltages respectively representing memory states "0", "1", "2" and "3". FIG. 7B illustrates the initial distribution of "erased" threshold voltages for an erased memory. FIG. 7C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 7B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structures

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 8:
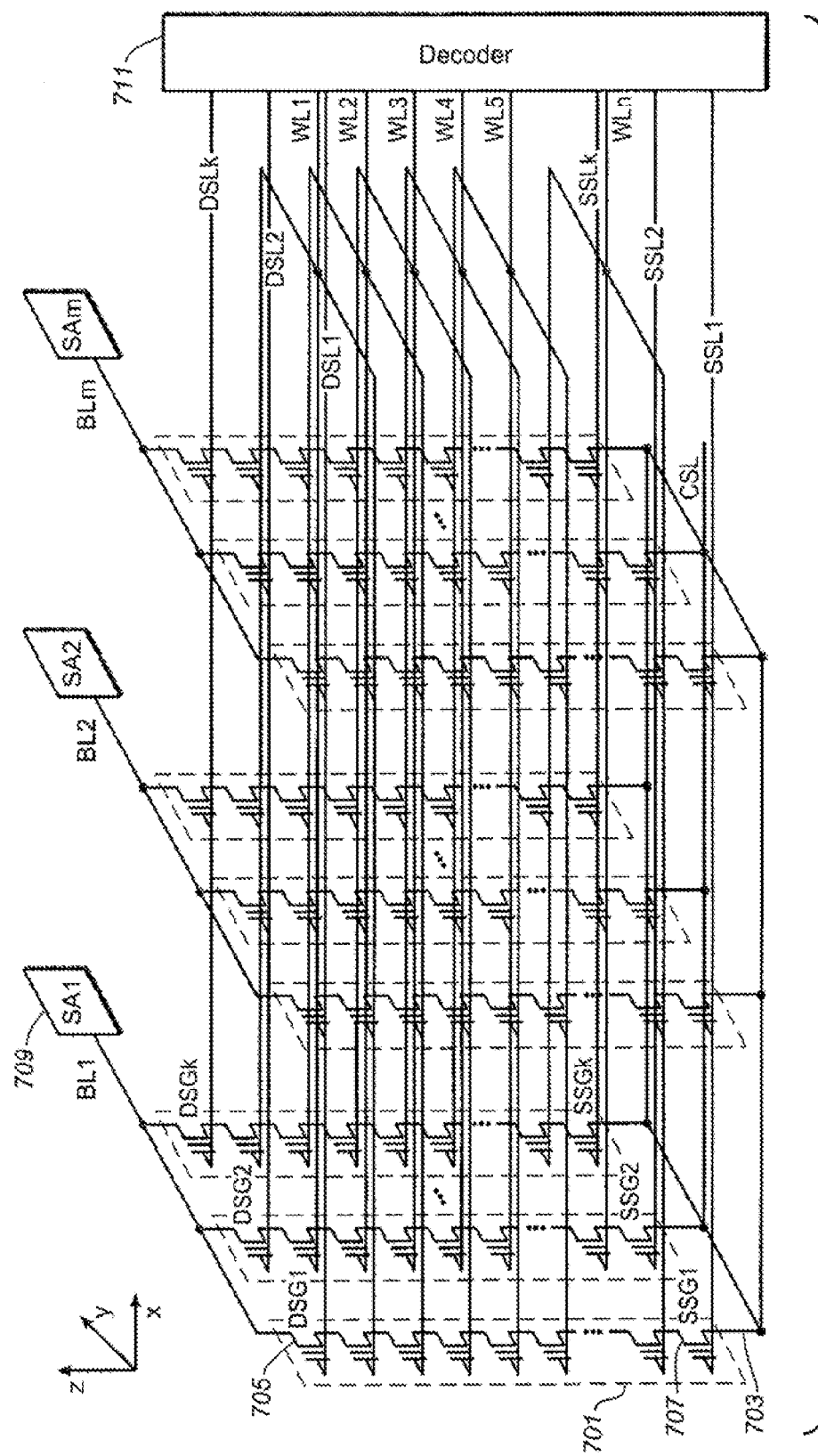
FIG. 8 shows an example of a physical structure of a 3-D NAND string.

FIG. 8 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both SLC and MLC operation is possible. While FIG. 8 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

A 3D NAND array can, loosely speaking, be formed tilting up the respective structures 50 and 210 of FIGS. 5 and 6 to be perpendicular to the x-y plane. In this example, each y-z plane corresponds to the page structure of FIG. 6, with m such plane at differing x locations. The (global) bit lines, BL1-m, each run across the top to an associated sense amp SA1-m. The word lines, WL1-n, and source and select lines SSL1-n and DSL1-n, then run in x direction, with the NAND string connected at bottom to a common source line CSL.

Figure 9:
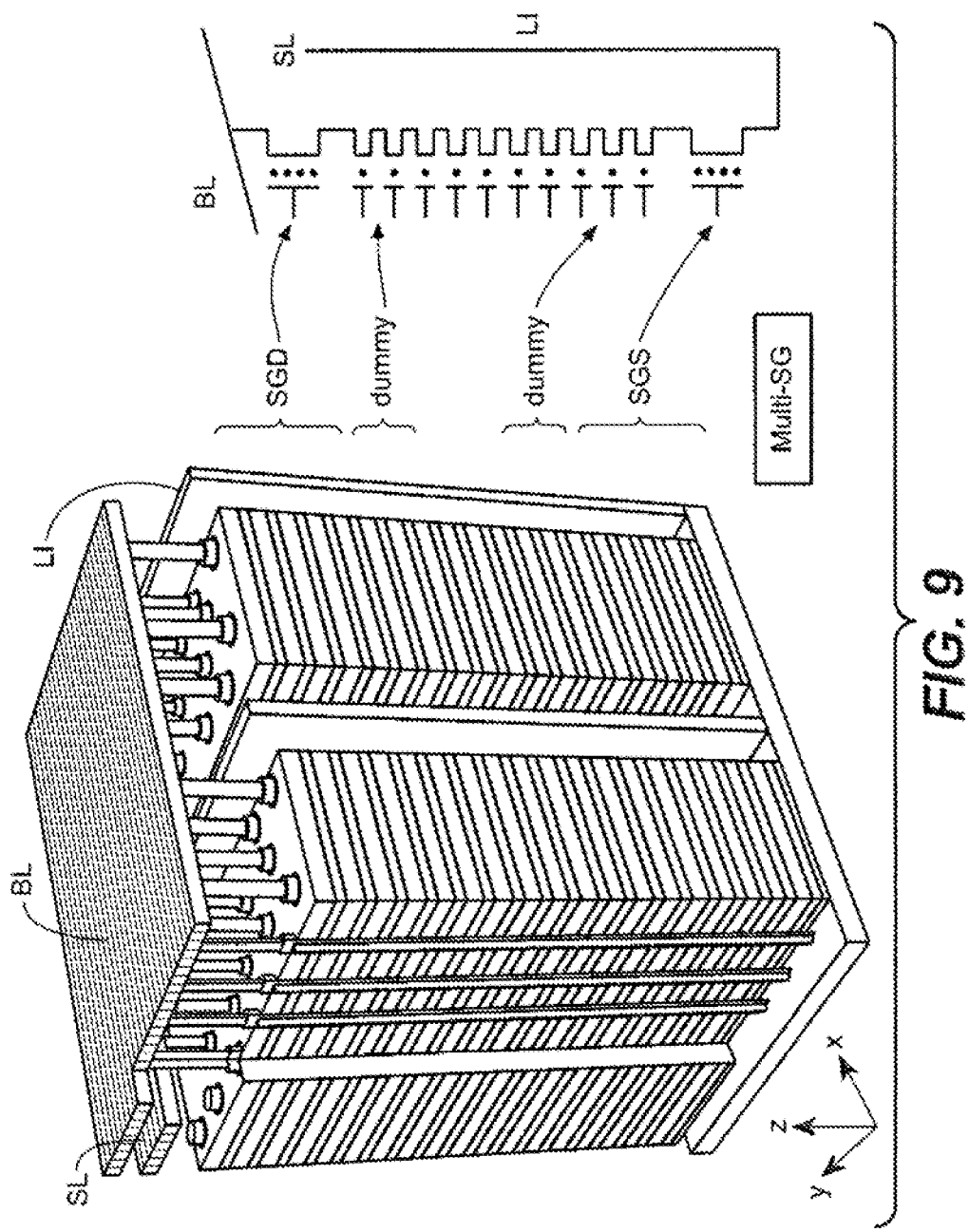
FIGS. 9-12 look at a particular monolithic three dimensional (3D) memory array of the NAND type (more specifically of the "BiCS" type).

FIGS. 9-12 look at a particular monolithic three dimensional (3D) memory array of the NAND type (more specifically of the "BiCS" type), where one or more memory device levels are formed above a single substrate, in more detail. FIG. 9 is an oblique projection of part of such a structure, showing a portion corresponding to two of the page structures in FIG. 5, where, depending on the embodiment, each of these could correspond to a separate block or be different "fingers" of the same block. Here, instead to the NAND strings lying in a common y-z plane, they are squashed together in the y direction, so that the NAND strings are somewhat staggered in the x direction. On the top, the NAND strings are connected along global bit lines (BL) spanning multiple such sub-divisions of the array that run in the x direction. Here, global common source lines (SL) also run across multiple such structures in the x direction and are connect to the sources at the bottoms of the NAND string, which are connected by a local interconnect (LI) that serves as the local common source line of the individual finger. Depending on the embodiment, the global source lines can span the whole, or just a portion, of the array structure. Rather than use the local interconnect (LI), variations can include the NAND string being formed in a U type structure, where part of the string itself runs back up.

To the right of FIG. 9 is a representation of the elements of one of the vertical NAND strings from the structure to the left. Multiple memory cells are connected through a drain select gate SGD to the associated bit line BL at the top and connected through the associated source select gate SGS to the associated local source line LI to a global source line SL. It is often useful to have a select gate with a greater length than that of memory cells, where this can alternately be achieved by having several select gates in series, making for more uniform processing of layers. Additionally, the select gates are programmable to have their threshold levels adjusted. This exemplary embodiment also includes several dummy cells at the ends that are not used to store user data, as their proximity to the select gates makes them more prone to disturbs.

Figure 10:
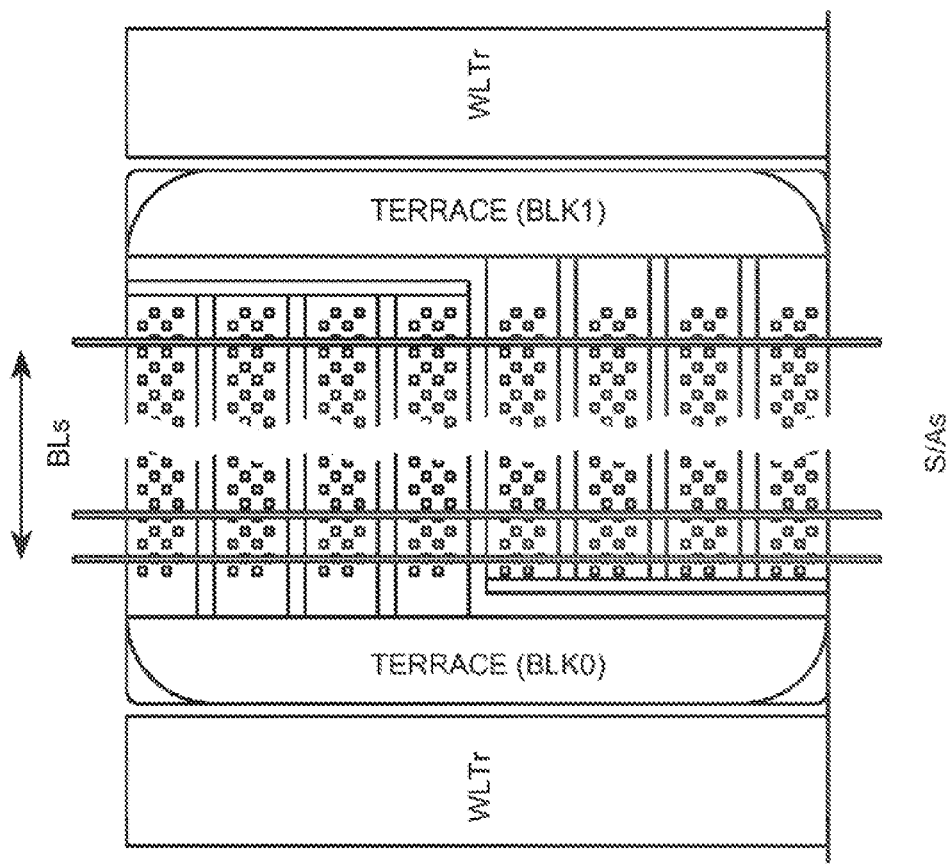

FIG. 10 shows a top view of the structure for two blocks in the exemplary embodiment. Two blocks (BLK0 above, BLK1 below) are shown, each having four fingers that run left to right. The word lines and select gate lines of each level also run left to right, with the word lines of the different fingers of the same block being commonly connected at a "terrace" and then on to receive their various voltage level through the word line select gates at WLTr. The word lines of a given layer in a block can also be commonly connected on the far side from the terrace. The selected gate lines can be individual for each level, rather common, allowing the fingers to be individually selected. The bit lines are shown running up and down the page and connect on to the sense amp circuits, where, depending on the embodiment, each sense amp can correspond to a single bit line or be multiplexed to several bit lines.

Figure 11:
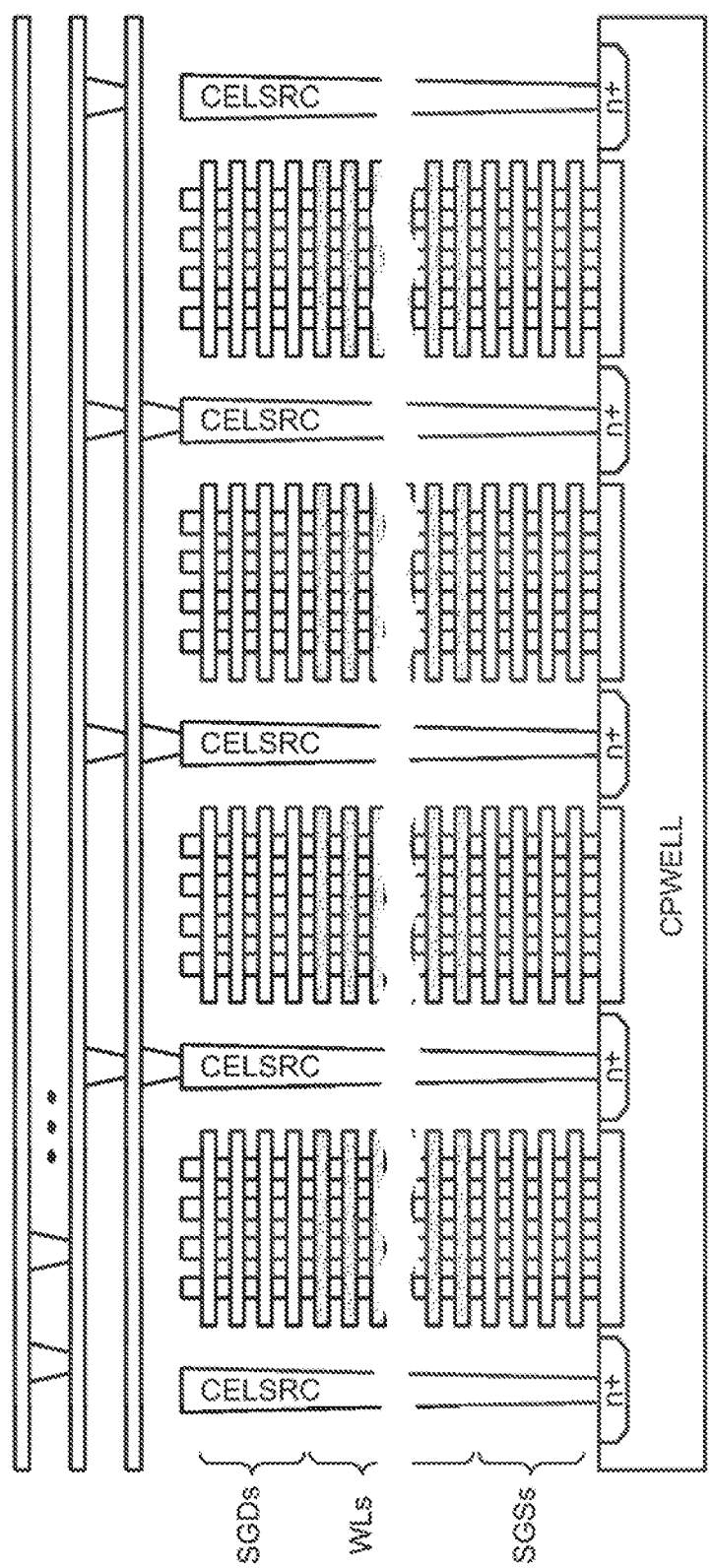

FIG. 11 shows a side view of one block, again with four fingers. In this exemplary embodiment, the select gates SGD and SGS at either end of the NAND strings are formed of four layers, with the word lines WL in-between, all formed over a CPWELL. A given finger is selected by setting its select gates to a level VSG and the word lines are biased according to the operation, such as a read voltage (VCGRV) for the selected word lines and the read-pass voltage (VREAD) for the non-selected word lines. The non-selected fingers can then be cut off by setting their select gates accordingly.

Figure 12:
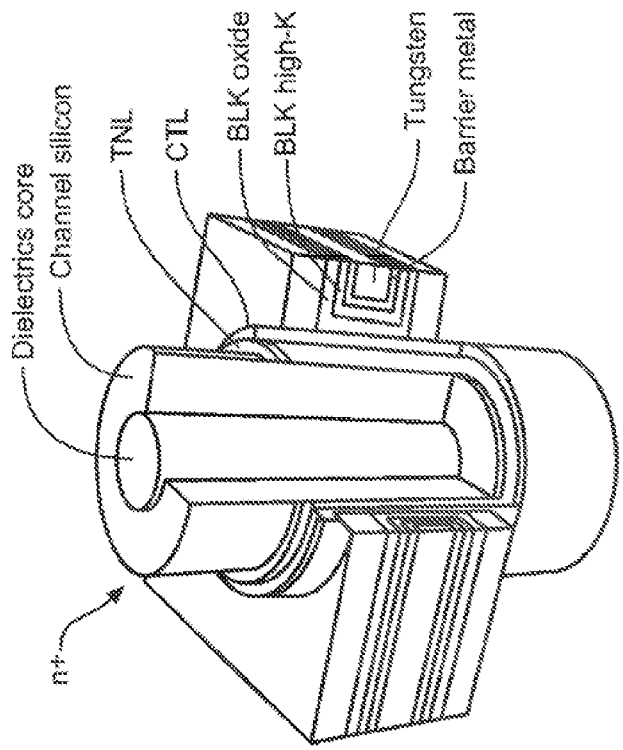

FIG. 12 illustrates some detail of an individual cell. A dielectric core runs in the vertical direction and is surrounded by a channel silicon layer, that is in turn surrounded a tunnel dielectric (TNL) and then the charge trapping dielectric layer (CTL). The gate of the cell is here formed of tungsten with which is surrounded by a metal barrier and is separated from the charge trapping layer by blocking (BLK) oxide and a high K layer.

Reducing Read Disturb in Partially Written Blocks

Performing an operation, such as a read, write or erase, on one location of a memory like those described above can affect the quality of data stored on another location of the memory, an effect called a "disturb". For example, due to capacitive coupling between memory cells on adjacent word line (or "Yupin-effect"), a voltage applied along one word line can affect the state of the memory cells on adjacent word lines. In the case of NAND memory, whether of the 2D or 3D variety, when reading a selected word line, non-selected word lines along shared NAND strings must also be biased. Referring back to FIG. 6, to read memory cells along WL3 requires that the cells along the other word lines be conducting. This is done by applying a voltage VREAD to all non-selected word lines (WL0-2 and WL4-n in this example) that is high enough so that non-selected memory cells on these word lines conduct regardless of the data state they hold. For example, for the states illustrated in FIGS. 7A-C, VREAD needs to be higher than the threshold voltages of the highest state's distribution. The cells on these non-selected word lines will then conduct and the cells along selected word lines can then be read by applying a sensing voltage VCG_R (such as one of the sensing voltages, such as $rV_1$, $rV_2$, or $rV_3$ in FIG. 7A) along the selected WL3. The application of this relatively high VREAD level can be a cause of read disturb, particularly for erased memory cells.

Word lines are typically written sequentially starting from one end, such as with the source end with WL0 in FIG. 6, and working through to WLn on the drain side. This section looks at techniques to reduce read disturbs on partially written blocks ("PBRD"), such as would happen when the memory system performs binary scan to find the last written page and for host reads to the block. This sort of binary scan is sometimes known as Last Written Page Detection or Find Last Good Page (LWPD/FLGP). Reads to partial written blocks are governed by host usage. There are multiple occasions when system may need to check for last written page, such as during write abort recovery, power interruption, and so on. Some memory system use a flag that is stored with a graceful power shutdown. In such events the boundary in known and LWPD/FLGP can be avoided, but not on all open blocks (especially the block in which the flag needs to be stored). In the case of ungraceful shutdown, the system needs to scan and identify if there was a power interruption during open block program or during idle time.

One way of doing last written page detection is with a binary scan to search for first page which reads ALL FF (fully erased). The last written page is the one before the first page which reads ALLFF. The scanning algorithm and pattern detection is typically done off-chip with a discrete controller chip. This incurs overhead associated with commands and data transfers. In multi-die systems, the scan times scale with the number of NAND chips per controller and can run into timeout constraints.

During these binary scans, the high bias VREAD is applied on drain side relative to the word lines being read. (In this example, the word lines are written in sequence from the source to the drain side.) The more the number of times last written page detection is done, the more drain side word lines are subjected to the high bias VREAD. As exposure to the high bias VREAD increases, drain side word lines can accumulate significant amount of disturb. Hence, when the system comes back and writes the previously unwritten drain side word lines, high bit error rate (BER) can be seen on drain side word lines. This situation is similar to read disturb on partial written blocks that happens on erased, un-written word lines when reading written word lines several times. In the case of LWPD, the boundary page (last written word line) is not yet known, so that it is not possible to apply methods which have a priori knowledge of the partial block boundary page.

The combination of NAND and the sequential writing of data pages onto word lines leads to a much higher level of read disturb on partially written blocks relative to fully written blocks. The reasons for the high bit error rate (BER) for the partially written block case can be explained by considering the partially written block case relative to the fully written block. In the case of a partially written block, only a few word lines may be written in a block, with the higher word lines in the write sequence still being erased. Some of the written word lines are read multiple times, with the higher word lines, that are erased, seeing the high VREAD bias that causes accumulated disturb. When the system comes back and writes the remaining word lines of the block higher word lines see read disturb followed by Yupin-effect word line to word line capacitive coupling during programming. For the fully written case, were all of the word lines have been written, some of the written word lines may also be read multiple times; but for the higher word lines that are already written, they see the high VREAD after Yupin-effect in the write process.

The higher BER is seen for the partially written block case since the higher, unwritten word lines see the read disturb first, while still erased, followed by the Yupin-effect during the subsequent write. (More detail on, and techniques related to, error arising from partial block reads is discussed in U.S. patent application Ser. No. 14/526,870 filed on Oct. 29, 2014.) For the fully written block, the latter word lines see the program related Yupin-effect first, followed by the read disturb. Since the amount of disturb is independent of initial erase depth, the erased state shifts up more when Yupin-effect is seen after disturb, i.e. for partial block case, resulting in a high BER. As a consequence, when doing binary search for last written page detection or reading data from the written pages, the system can expect a high BER on erased/un-written word lines after the whole block is written.

As noted above, one way to find the last written page of a block is to perform a binary search of the block's word lines, a technique that can lead to a large number of reads, and corresponding bit error rates, on partially written blocks. To reduce the bit error rate, the following describes the use of a reduced VREAD level for some of the non-selected word lines, a technique that can be extended to data reads. When doing a last written page search, the reduced VREAD technique can also be used to intelligently skip word lines when searching through a block from one end to the other. Further, to improve performance during a last written page search, whether in a binary search or when searching from the end, reduced settling times can be used.

To determine the last written of a sequentially written set of word line, it is not necessarily provide an accurate read of the data along the word line, but just to determine whether it has been written or is still in an erased state. The described techniques can be implemented as an on-chip, auto-scan feature for last written page detection. When performing the sensing operation, a lower VREAD (or VREAD_PARTIAL) is applied to drain side word lines (that is, the word lines written latter in the write sequence order). The sensing operation with the reduced VREAD_PARTIAL can also be used to determine how many word lines to skip in the process based on how may bits are read as a "1".

Considering these in turn and looking at the lowered VREAD level, in a standard sensing operation for a NAND type memory the non-selected word lines need to biased to a level that allows them to conduct for any programmed data state; however, for an unwritten word line, the erased memory cells will turn on at a lower voltage, the using of which will result less disturb on the unprogrammed cells. Consequently, when searching for the last written word line, when performing a read some or all of the word lines later in the write order than the word can have applied the lower VREAD_PARTIAL; using the example where word lines are written in order from the source end of the NAND strings, VREAD_PARTIAL can be applied to all word lines on the drain side of the selected word line. This can be illustrated with respect to FIG. 13.

The left-most column in FIG. 13 shows the word line numbers, where these are numbered in the sequential order in which they are written, starting in this example with WL0 on the source side and working toward WL64 on the drain/bit line end. The last written word line is here taken to be WL_i. In the read of the left "Bias", WL0 selected and all the other word line receive the VREAD_PARTIAL level. As the word lines from WL1 to WL_i are written, some cells along these word lines may not conduct for VREAD_PARTIAL so that this modified sensing operation may not yield an accurate data read, yielding a false "1", but it will allow a determination of whether WL0 has been written. Similarly, for a word line WL_n as shown in the middle "Bias" column, the word lines on the source side (WL0 to WL_n−1) need to not contribute and are set at the full VREAD, while the (potentially unwritten) WL_n+1 to WL64 are set at VREAD_PARTIAL. The process would be done similarly, with similar results, for all word lines up to and including the last written word line WL_i, the only difference being that the read of WL_i would be an accurate read. For WL_i+1 in the right "Bias" column, the written word lines WL0 to WL_i will all receive VREAD and be conducting; VREAD_PARTIAL is only applied to unwritten word lines WL_i+2 to WL64, so they will also be conducting; and the sensing voltage VCG_R on WL_i+1 will accurate indicate that it has not been written.

The use of the lower VREAD_PARTIAL can help to reduce the disturb accumulated on drain side erased word lines, thereby reducing bit error rates. This is shown in the plot of FIG. 14, that is based on device data and where the horizontal axis is the number of read cycles and the vertical axis is an indication of bit error rates along a word line. The behavior of a fully written block is shown at 1401 and for a partially written block that uses the full VREAD for all word line at 1403. In this example, VREAD is on the order of several volts. The effect of reducing VREAD_PARTIAL incrementally by about 7%, 10%, and 20% relative to VREAD is respectively shown at 1405, 1407, and 1409. As shown on the plot, reducing VREAD_PARTIAL by around 20% relative to VREAD will significantly reduce disturb on partially written blocks to a level similar to disturb on wholly written blocks.

In the embodiment illustrated with respect to FIG. 13, all of the word lines on the drain of the selected word line are set to VREAD_PARTIAL. In other cases, it may be more practical to set only some of these word lines at the lower level; for example, if word line decoding uses a zone structure, where word lines are grouped into contiguous sets, it may make sense to apply VREAD_PARTIAL to only the word lines of entire zones that fall on the drain side of the currently selected word line. As to the level used for VREAD_PARTIAL relative to the standard VREAD, this can be a fixed offset or can depend on the device's age, number of program/erase cycles the block has seen, number of word lines, or other factors.

The use of the reduced VREAD_PARTIAL when searching for the last written page can be used for a binary search as well as other algorithms. For instance, the search can be made by progressing from the source end to drain end, skipping word lines along the way where, as alluded to above, the result of reading a written word line with the lowered VREAD_PARTIAL can be used as part of an intelligent algorithm to decide how many word lines to skip.

The Last Written Page Detection (LWPD) can be sped up by skipping some number of word lines, but still having some or all of the drain side word lines at a lower bias VREAD_PARTIAL. Due to the NAND structure, the number of "1"s in the pattern will be a logical "AND" of all the word lines at VREAD_PARTIAL. As the number of word lines at VREAD_PARTIAL decreases, the number of "1's" decreases; and as level of VREAD_PARTIAL decreases, the number of "1"s decreases. So measuring the number of "1"s at a given voltage can provide an estimate of the distance to the true boundary. Consequently, an exemplary scan algorithm can base the number of skipped word lines on the number of "1" bits read after the scan: if "1" bits are less than a criterion, then the presumption is that it is far from the boundary and the algorithm can do a big step for skipped number of word lines; otherwise, a smaller step of fewer word lines is used. Depending upon the VREAD_PARTIAL bias, the criteria for skipping WLs can be set.

Figure 15:
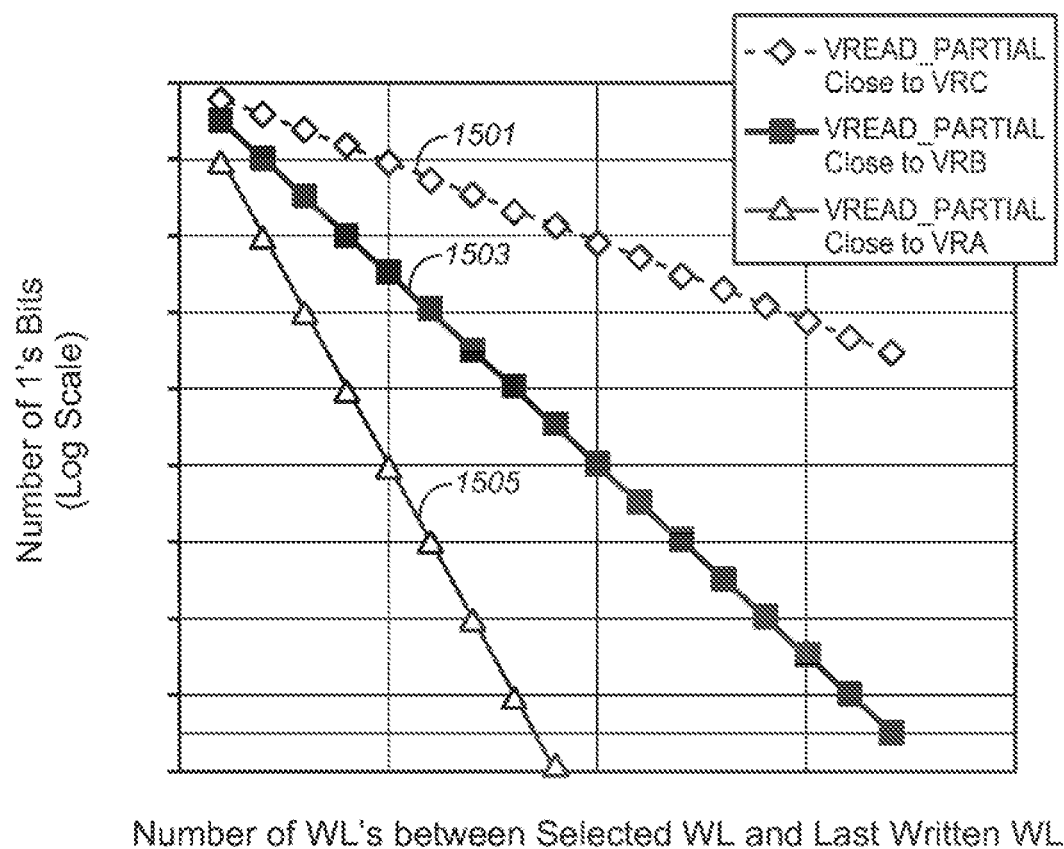
FIG. 15 graphically represents the relationship between the number of "1" bits and the number of word lines between a selected and the last written word line for different VREAD_PATIAL levels.

This is illustrated in the plot of FIG. 15, where horizontal axis is the number of word lines between the selected word line and the last written word line, and the vertical axis is the expected number of "1" bits. This example is for a 2 bit per cell embodiment, where the states are labelled Er, A, B, C in order of increasing thresholds. The voltage VRC is used to distinguish between the B and C states and is shown at 1501; the voltage VRB is used to distinguish between A and B states and is shown at 1503; and the VRA voltage is used to distinguish between the Er and A states and is shown at 1505.

Figure 16:
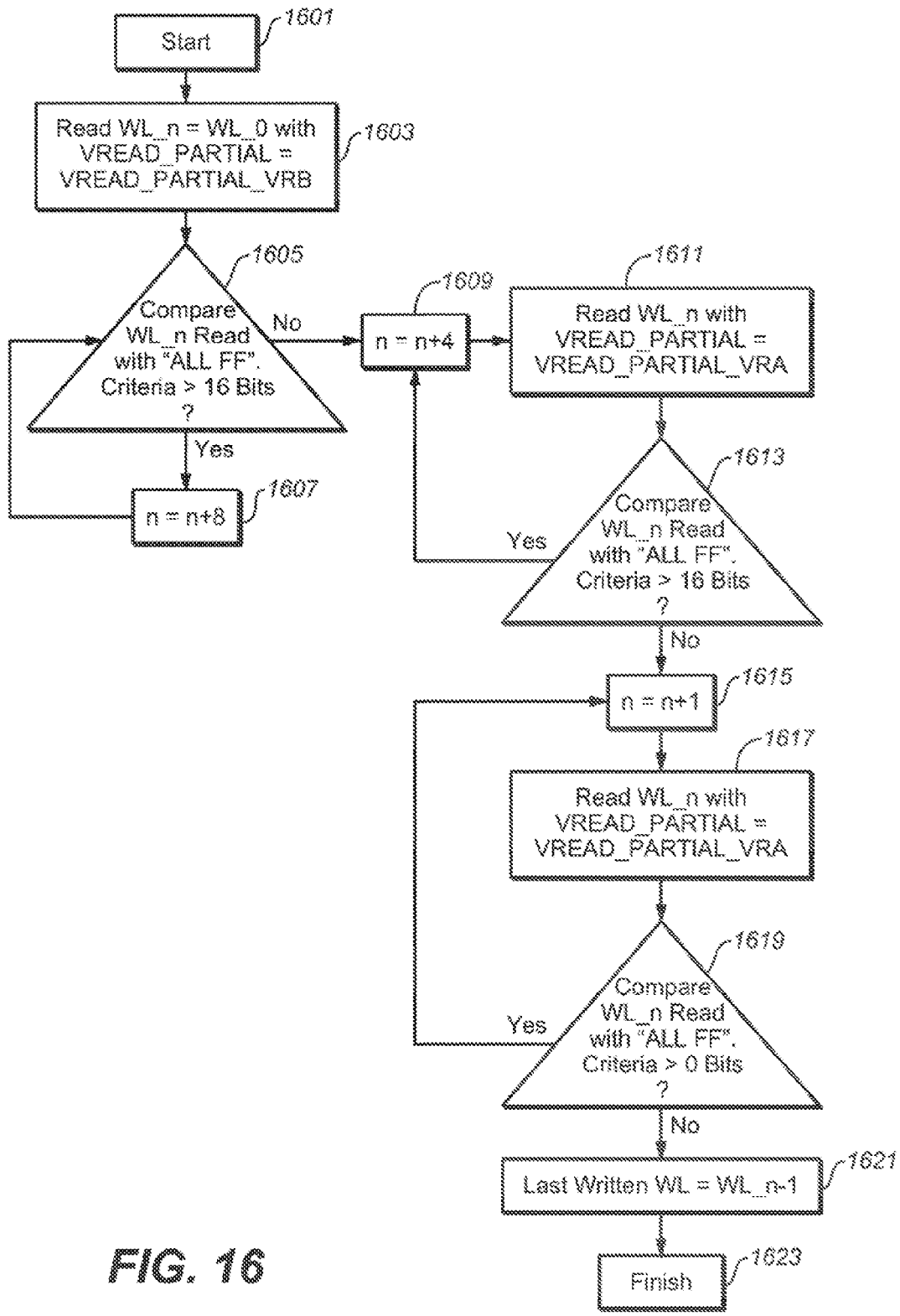
FIG. 16 is an example of an algorithm that intelligently decides how may word lines to skip between reads when determining a last written word line.

Say, for example, the algorithm starts with VREAD_PARTIAL close to VRB (i.e., all cells with B-state/C-state on drain side WLs will cut-off the NAND string and hence, will make threshold voltages on selected word lines appear high, i.e. as a 0-bit) due to an increase in NAND string resistances. If the algorithm uses can a criterion of, say, 16 bits, then it can step ~8 word lines without having to worry about over-stepping past the last written word line. Then, switching to a VREAD_PARTIAL to close to VRA, it can step ~4 word lines until the time criteria of 16 bits is reached. Finally, it can switch to 1 word line at a time until getting an ALL FF result. FIG. 16 illustrates such an algorithm.

The flow of FIG. 16 starts at 1601 and at 1603 WL0 is read using a VREAD_PARTIAL level close to VRB. At 1605 it is determined whether the read at 1603 meets the criterion of ALL FF values being greater than, in this example, 16 bits. If yes, the selected word line value is incremented at 1607 by 8 and the process loops back to 1605. If the criterion is not met, the word line value is only incremented by 4 at 1609 and the flow goes to 1611. The selected word line is then read at 1613, where the VREAD_PARTIAL level is dropped down to near the VRA level. The read result is then compared to the criterion at 1613: if passes, n incremented by 4 at 1609 before looping back to 1611; if "No", the count is incremented by 1 at 1615 before being read at 1617 checked against the criterion at 1619. If 1619 gives a "Yes", the process loops back to 1615; if "No", the last written word line is WL_n−1 (1621), at which point the flow ends (1623). This algorithm can speeds up the LWPD search, while only subjecting the drain side word lines to VREAD_PARTIAL, reducing disturb issues on partially written blocks. A number of variations on this algorithm can be used, including backing up in case of over-shoot or a hybridized binary search.

Figure 17:
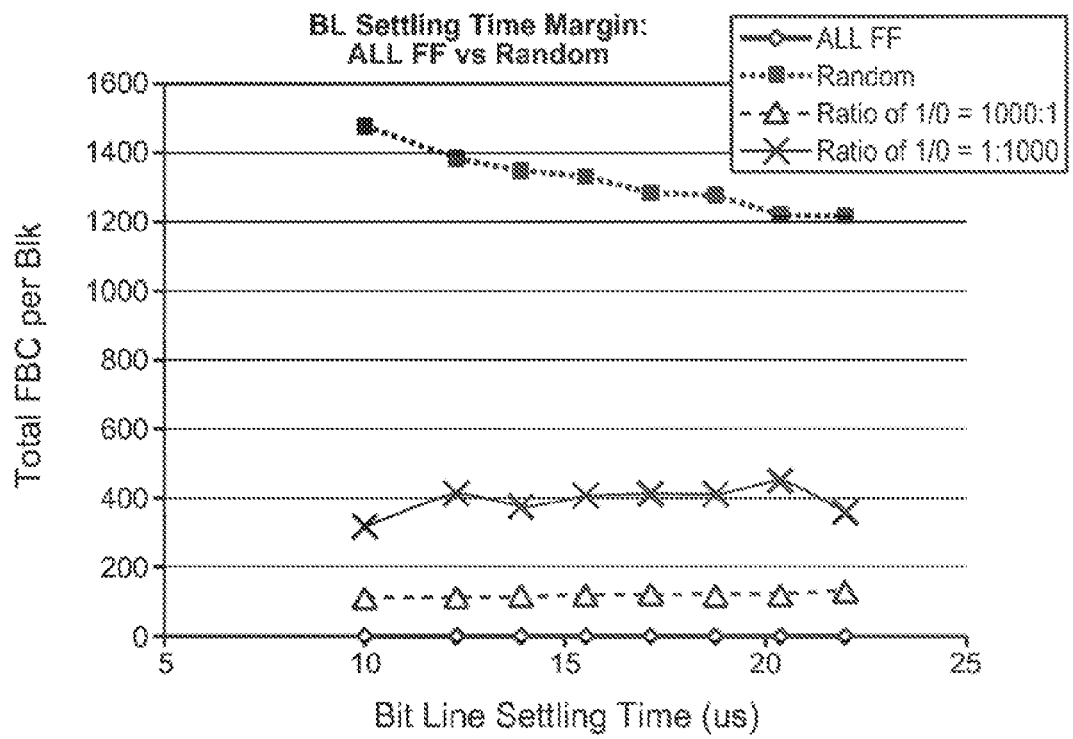
FIG. 17 illustrates differences in bit line settling times for different data patterns.

For any of the LWPD algorithms, whether using a reduced VREAD_PARTIAL or not, the process can be accelerated by performing the ALL-FF detection with smaller bit line settling times. In a sensing operation, before the sensing voltage is applied to the selected word line, it is usual to settle some voltage level on the bit lines in order accurately read the page. As a LWPD need not read the data as accurately, this is one reason why the settling time can be shorted. Another reason is that the bit lines should also settle more quickly in a partially written block since all of the unwritten bit lines will have the same data (namely, all in an erased state), reducing the effect of differing states on different bit lines has on how quickly settling can occur. This effect is illustrated in FIG. 17. In FIG. 17, the number of incorrect bits (FBC) is plotted against bit line settling times.

These various aspects can all help to accelerate the LWPD process so that a process that previously would need to involve the controller can now be done by the memory chip itself. In such a last page to be written search, it is not known up front which pages are not written, but many these aspects described above can also be applied to reading partially written blocks in a data read operation when there is prior knowledge of which pages are unwritten.

When performing a read to extract a page of data along a word line of NAND memory, the non-selected word lines are biased so that they will conduct independently of the stored data. For the standard VREAD, this needs to be a level above the threshold of the highest states. If the memory system knows that a block is only partially written, and knows which of the word lines are unwritten, a lower VREAD_PARTIAL can be used on some or all of these unwritten word lines, reducing their disturb level while still allowing them to conduct. This lower VREAD_PARTIAL can be used on all of the unwritten word lines, even where these are not written sequentially, or a subset, such as when word lines are organized as zones and only fully unwritten zones use the lowered value.

Figure 18:
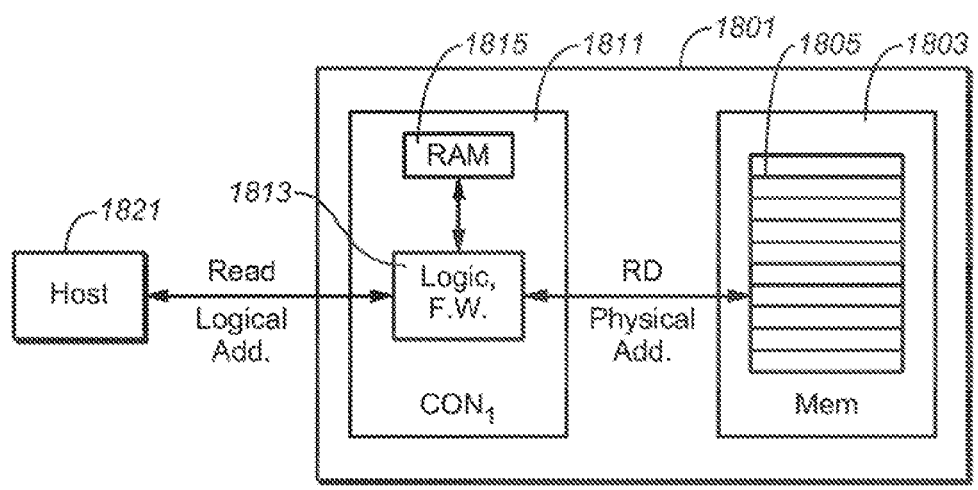
FIG. 18 is a block diagram to help illustrate a modified read operation using a reduced VPASS on unwritten word lines.

FIG. 18 is an example of a simplified box diagram to illustrate the situation. A host 1821 sends a read command the memory system 1801, where the memory system could a memory card, embedded memory system, solid state drive (SSD) and so on. The memory system 1801 is here taken to be formed of a controller 1811 and a number of memory chips, only one of which is shown at 1803; and on the memory chip 1803, only an array 1805 divided into multiple blocks is explicitly represented. A host typically bases a read command on a logical address that the controller the controller then converts into a corresponding physical address for where the data is stored on the memory circuit. The logical address is received at the controller 1811, where the logic circuitry/firmware 1813 use conversion information, typically stored in RAM 1815, to obtain the physical address used when passing the read command on to the memory circuit. Based on the physical address, the logic circuitry/firmware 1813 can also determine whether the corresponding block is only partially written, where this could also be done based on a list stored in RAM 1815. Alternately, the memory chip itself could make the determination that the read command is for a partially written block.

In one implementation, when sending the read command from the controller 1811 to the memory 1803, the logic circuitry/firmware 1813 can send an additional prefix command with, say, 1 byte address to the NAND memory 1803 indicating where the written/unwritten word line boundary is. Once the boundary in known by the NAND, it can setup the voltages on the word lines beyond the written area accordingly. Similarly, for multi-plane operation, a prefix can be issued separately for each plane, as the open block may be written up to a different page (n−1) on different planes. The word line/page information can be used to approximate the boundary if a group of word lines are part of the same driver circuit. In this case the exact boundary need not be used, but set at the edge of the zone.

In the preceding, the read was initiated by the host, but this technique can also be applied to reads originating on the memory circuit itself, such as arise in data relocation or data scrub operations. The read can be for user data or for system data reads, where the latter more typically have partially written blocks (and often more sensitive data) due to its nature.

One set of examples of where sensing operations are performed on partially written, or "open", blocks is for verify operations, both those done between programming pulses and for post-write read verifications, such as for Enhanced Post Write Read (EPWR) operations. The memory system performs reads on the open blocks frequently for operations like "rolling" EPWR, such as where EPWR is performed on a word line WLn−1 when the adjacent word line WLn has just completed a program stage. This kind of open block reads can cause read disturb on the drain side word lines since they are in Erased state, which frequently leads to uncorrectable ECC (UECC) events or higher BER on those word lines. If the memory circuit has a mode to read open blocks with a lower bias on the un-programmed word lines, then it can help to resolve this issue.

With knowledge of first un-programmed word line, the memory circuit can use this information to apply a lower VREAD bias on all the word lines including and above the un-programmed word line. As with the above discussion, the memory circuit can either keep track of this information during the write process or the controller can pass the address of the first un-programmed word line to the memory through a series of address and commands preceding the actual command sequence to read. The memory can then apply this lower VREAD bias on the word lines when the first erased word line is within a certain range of the word line that is selected for sensing.

For example, the controller can issue a command and address sequence to read the NAND memory having a first portion to indicate that the following address cycle will specify the address of the first erased word line. This command is one that can be latched only on the selected chip and have, say, 1 Byte to specify the address of the un-programmed word line and that can be reset at the end of a read operation. If the first un-programmed word line falls within a certain range of the word line that is being read, a low bias (VREAD_PARTIAL above or, more succinctly, VPVD in the following) can be applied to all the un-programmed word lines. An example of this range is specified in Table 1. This example shows the word lines spit into 14 word line zone (control gate, or CG, zones), the corresponding word line ranges, the word line at which the lower VREAD (VPVD) starts.

TABLE 1

| Selected CG Zone | Selected WL | VPVD start WL |
| --- | --- | --- |
| 1 | <=WL16 | <=WL24 |
| 2 | WL17-WL24 | <=WL33 |
| 3 | WL25-WL32 | <=WL41 |
| 4 | WL33-WL40 | <=WL49 |
| 5 | WL41-WL48 | <=WL57 |
| 6 | WL49-WL56 | <=WL65 |
| 7 | WL57-WL64 | <=WL73 |
| 8 | WL65-WL72 | <=WL81 |
| 9 | WL73-WL80 | <=WL89 |
| 10 | WL81-WL88 | <=WL97 |
| 11 | WL89-WL96 | <=WL105 |
| 12 | WL97-WL104 | <=WL113 |
| 13 | WL105-WL112 | <=WL121 |
| 14 | WL113-WL127 | <=WL127 |

Figure 19:
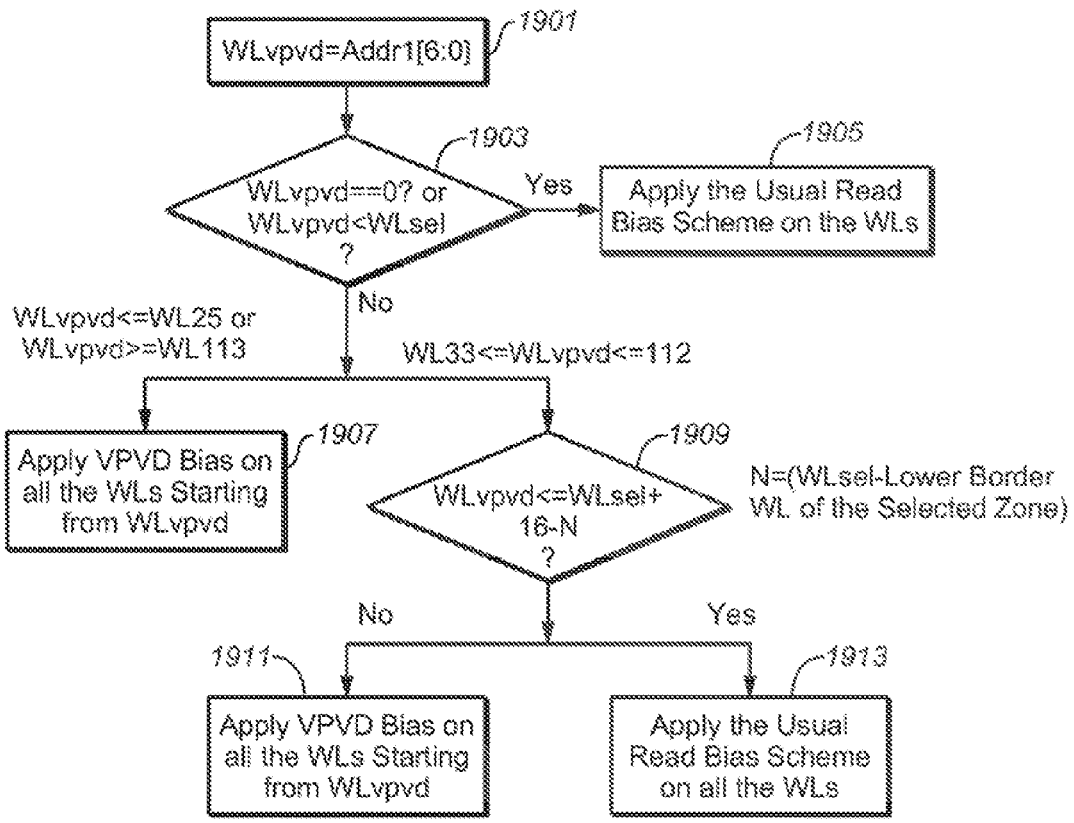
FIG. 19 is an exemplary flow for using a lower VREAD bias on un-programmed word lines.

FIG. 19 is an exemplary flow for using a lower VREAD bias on un-programmed word lines, such as can be done as part of a post write read verification process. At 1901 a byte (Addr1) specifying the first un-written word line (WLvpvd) is provided from the controller. (Alternately, if the memory tracks or determines the first unwritten word line, the determination can be made internally.) It is then determined (1903) whether the first un-written word line is zero (block written) or if it is below the selected word line (WLsel) and, if so (1905), the usual word line biasing is used. If not, and the WLvpvd value specifies an end zone (zones 1 and 14 in the example of Table 1), the reduced VPVD bias is used on all the word lines starting from the specified value. If for a non-end zone, the proximity of the specified word line to the selected word line is determined at 1909 and if far enough away the VPVD value is used starting at WLvpvd (1913) and if not far enough away the usual read bias is used (1911).

Figure 20:
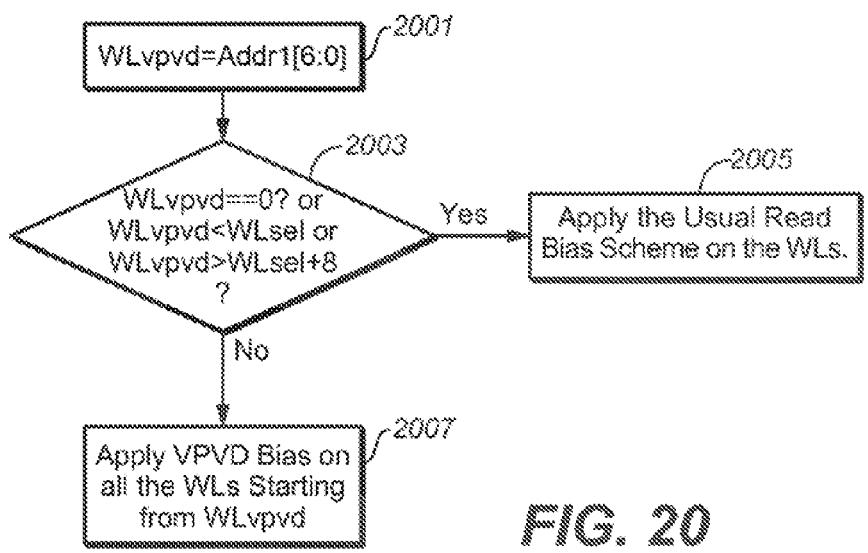
FIG. 20 is a flow for a simplified embodiment for using a lower VREAD bias on un-programmed word lines.

FIG. 20 is a flow of an example of a simplified embodiment, where the memory applies a lower VREAD bias on the un-programmed word lines only if the first un-programmed word line is within an 8 word line range of the selected word line. The flow again begins with receiving the location of the first un-written word line at 2001. Relative to 1903, the decision at 2003 now also considers whether the first un-programmed word line is within an 8 word line range of the selected word line (WLvpvd>WLsel+8). The "Yes" path then leads to use of the usual word line biases (2005), while the "No" path applies (2007) the reduced VPVD on all word lines starting from that specified in 2001.

Alternate Boundary Word Line Search

This section looks an alternate method for finding the last written word line of a partially written block, where the word lines of a block are split up into several zones in order to find in which zone the last programmed WL resides. The memory can then perform a fine search of the identified zone to find the exact location of the last programmed word line.

For example, the coarse step involves dividing the word lines, on which the memory cells of the NAND chains of the block are connected, into, say, 4 zones with each zone having 31-33 word lines. (Different number of zones in both coarse and fine steps can be used, as this is a design choice, and the number of word lines per zone will depend on the number word lines in a block, where it is generally being more efficient to use more or less equal sized zones at each step.) Assuming that word lines are written sequentially from the lower (source) end of the NAND strings, the memory can then sense the NAND chains by applying a high VREAD bias on the lowermost zone and a low VREAD bias (or VPVD) on rest of the zones. (If the word lines are instead written starting at the top, or drain, end, the process would instead go from highest to lowest.) Here VREAD can be the standard bias level for non-selected word lines in a sensing operation, which needs to be high enough for a cell to conduct for any of the data states written into it. The VPVD bias level is lower than VREAD, to reduce disturb, but needs to allow an erased cell to conduct. If all the NAND chains are conducting, this would indicate that the last programmed word line lies in the lower zone or zones with all of the word lines set at VREAD. (More generally, rather than require all NAND chains conduct, an option is to allow a few non-conducting chains, such as by adding a parameter for this.) If the NAND strings are not conducting, then the method can continue the search by extending the VREAD bias to the next zone, continuing this process until it finds the zone that causes some of the NAND chains to become non-conducting when VPVD bias is applied to that zone. This way the system narrows the search down to a zone of word lines that has the boundary WL.

The identified coarse zone can then be sub-divided into, for example, four smaller zones of 8 word lines each and use the same approach as for the coarse zones to narrow down further into a group of 8 word lines that have the last programmed word lines. While executing this fine step, all the word lines below the selected zone are biased at VREAD and all the word lines above the selected zone are biased at VPVD. Note that unlike in the previous section, where the determination was made with respect to a specific word line set at a sensing voltage, here the determination is made on a zone basis, with only the regular non-selected word line VREAD and the lower VPVD. This can simplify the decoding, both in that a sensing voltage is not needed and in that VREAD and VPVD levels are applied at the zone level.

Once narrowed down to an 8 word line zone, the process can either continue to follow this approach to narrow down to the last written WL by dividing the bigger zone into smaller zones (such as 2 word lines each) or, alternatively, by conducting a binary search on the 8 word line zone.

Considering the method further, the exemplary algorithm to search for the boundary word line in an open block can be divided into a coarse search and a fine search. Taking an example of where blocks have 128 word lines, in the NAND chains can be divided in to four zones, such as shown in Table 2.

TABLE 2

| WL # | Zone(N) |
| --- | --- |
| 0-32 | 1 |
| 33-64 | 2 |
| 65-96 | 3 |
| 97-127 | 4 |

Starting a N=1, the block is sensed with VREAD on word lines in zone 1 and below and the low bias on zones N+1 and above. The number of non-conducting NAND chains is then counted, such as by counting the number of 0's in the corresponding data latches, and compared to a criterion. The criterion can be fixed or it can be a memory parameter that can be set by the user. If the number of non-conducting NAND chains is less than the criterion, this corresponds to the last programmed word line being in Zone-N. In this case, the process jumps to the Fine Search. If the number of non-conducting NAND chains is higher than the criterion, the last programmed WL is in zones N+1 or above, in which case, the process sets N=N+1 and repeats the sensing and counting.

Figures 21, 22:
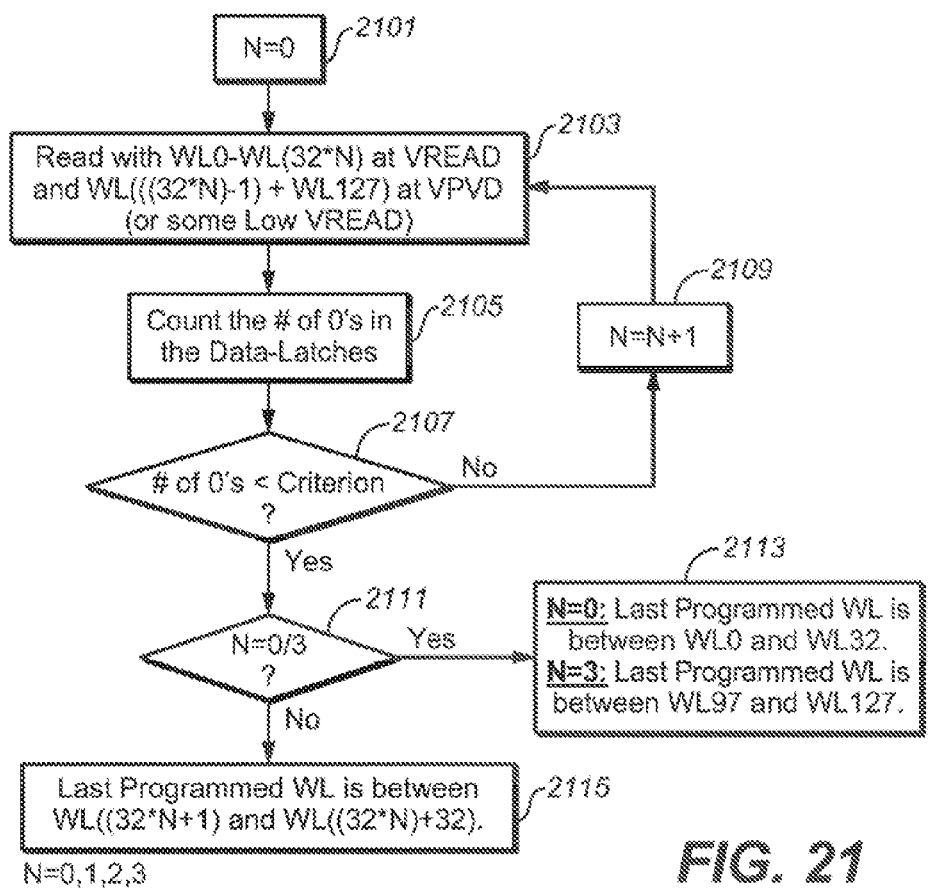
FIG. 21 is a flowchart for an exemplary embodiment of a coarse search for the last written word line.
FIG. 22 illustrates the bias levels applied to word lines in the coarse search.

FIG. 21 is a flow chart for a coarse search phase and FIG. 22 is schematic representation of the zone level biasing for an exemplary embodiment. In FIG. 22 the left-most columns lists the adjacent sets of word lines that are in the corresponding one of zones 1-4 as shown in the next column. As shown in the left-most, the example of FIGS. 21 and 22 illustrates the use of differing zone sizes that can optimized to the device. For this example, the first and last zones have a different size (33 and 31 word lines, rather than 32) to accommodate various boosting modes that could be used during programming. The next four columns show the zone biasing for the four iterations of boundary determining the sense operation, where VREAD is applied to the lower zones and the lower VPVD to the upper zones. For example, if the NAND strings conduct with biasing for N=1, but did not conduct with the biasing of N=0, this would correspond to the last written word line being in zone 2. Note that the N=3 biasing is optional since if the block is not fully written, but still did not conduct at the N=2 biasing, then the last written word line would lie in zone 4.

Backing up to the flow of FIG. 21, the flow begins setting N=0 at 2101, with a read using the corresponding bias conditions as shown in FIG. 22 at 2103. The number of non-conducting word lines is counted at 2105 and at 2107 it is checked to see if the count meets the criterion: If so, the last written word line is in the corresponding zone, zone N+1; if not, the value of N is incremented at 2109 and the flow loops back to 2103 for the next zone, if there is one. When the criteria is met, the last written word line's zone is then determined. In this example using different sized zones at the end, the end zones are considered at 2113 and medial zones at 2115.

Figure 23:
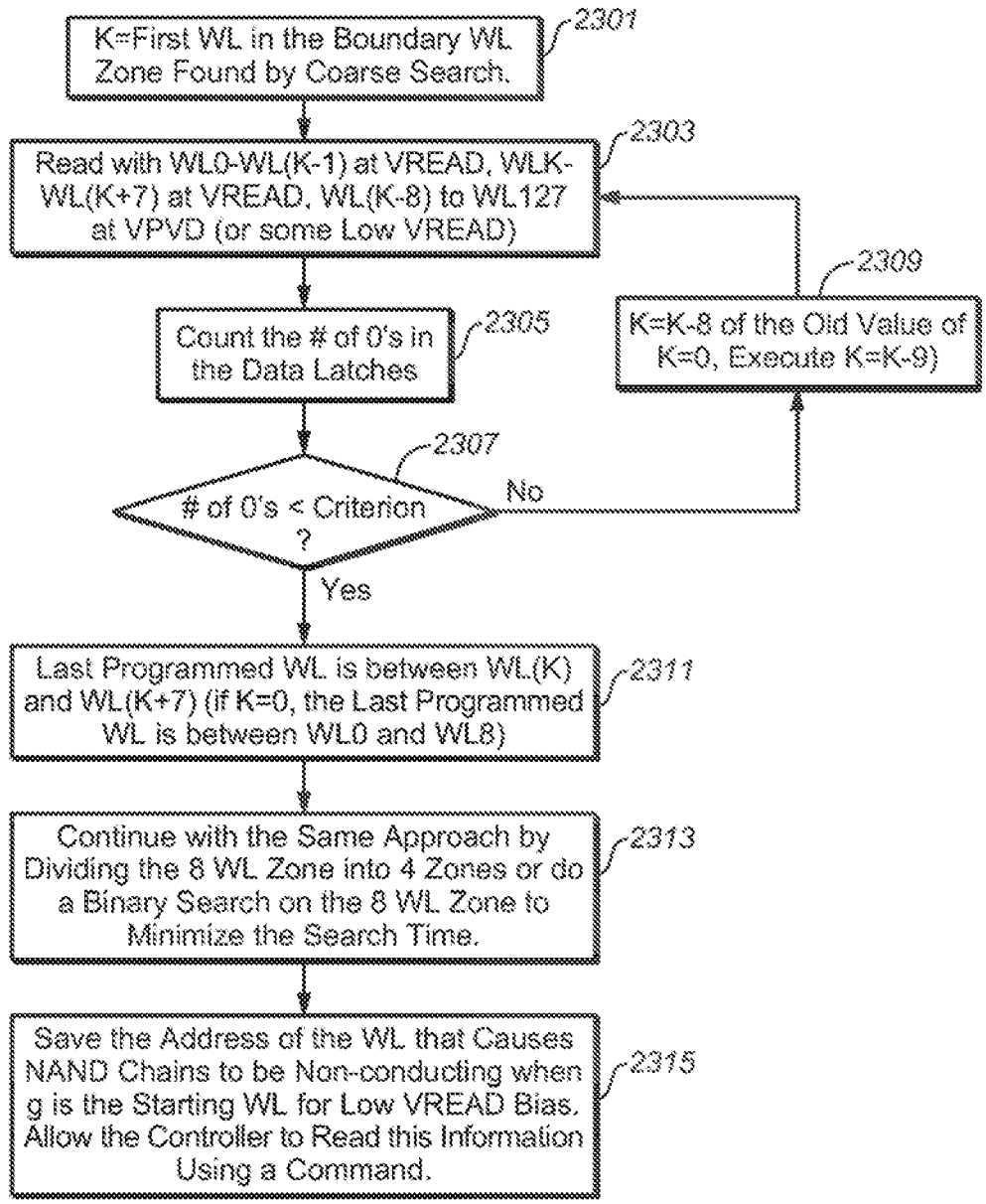
FIG. 23 is a flowchart for an exemplary embodiment of a fine search for the last written word line.

FIGS. 23 and 24 illustrate the fine search for an exemplary embodiment. As shown in FIG. 24, the identified zone is subdivided into four sub-zones and biased similarly to FIG. 22, where the word lines below WLk will be at Vread and the word lines above WLk+31 will be at VPVD. As with the coarse search, three sensings are needed to determining which subdivision has the last written word line, where the fourth sensing can be used as a check, if desired. In the fine search flow of FIG. 23, the flow begins at 2301 by starting with the first sub-division of the zone identified in the coarse search. At 2303 it is biased as illustrated in FIG. 24 and sensed, with the number of non-conducting NAND strings is counted at 2305. The count is checked at 2307 and if the count is not below the criterion, the flow loops back to 2303 after K being incremented at 2309. As the subdivisions at this point are of 8 word lines, K is incremented by 8. (In the exemplary embodiment, Zone 0 of the coarse search was taken to have 33 word lines and this is reflected in different incrementation for K=0.) As with the coarse flow, if the sense was at the next to last subdivision, the NO result from 2307 can continue to 2311 using the last of the subdivisions.

If the criterion is met at 2307, the subdivision is established (2311) and it can then be subdivided again and the process repeated (2313) in order determine the last written word line at 2315.

The techniques of this section can be implemented in a fully digital manner and do not rely upon a judgment based upon statics of the data patterns written along the NAND strings. As such, it is applicable to all data patterns, including pure 0 and pure 1 patterns, even when the number of allowed non-conducting NAND chains is set at zero. As the exemplary embodiments do not rely upon analog circuitry to distinguish between highly conducting and less conducting NAND chains, is very accurate and avoids the need to do a backwards scan once it has narrowed the search down to a particular zone, sub-zone or WL. As there is no requirement of additional high-voltage switches on the memory circuit, the techniques of this section can be implemented in an area efficient manner.

Accurate Abort Condition Detection for Multi-State Memories

The preceding section have looked at techniques for the determining the last written, or first unwritten, word line. This section looks at the degree to which programming has progresses on the last word line on which programming may have begun. When a write process ends normally, the last written word line in an open block will have finished writing; however, in the case of a write abort, such as due to power loss or other "ungraceful" or unexpected power down, the programming of a word line may have started, but not completed. For example, in the exemplary multi-state embodiments, the abort may occur when the lower stages or pages have written, but not the higher states or pages. A power loss can occur during a write operation to any storage system. In many applications, it is desired that data written previously be protected. The techniques of this section allow the memory system to detect an abort condition on power up of a system storing data in a multi-state memory.

Figure 25:
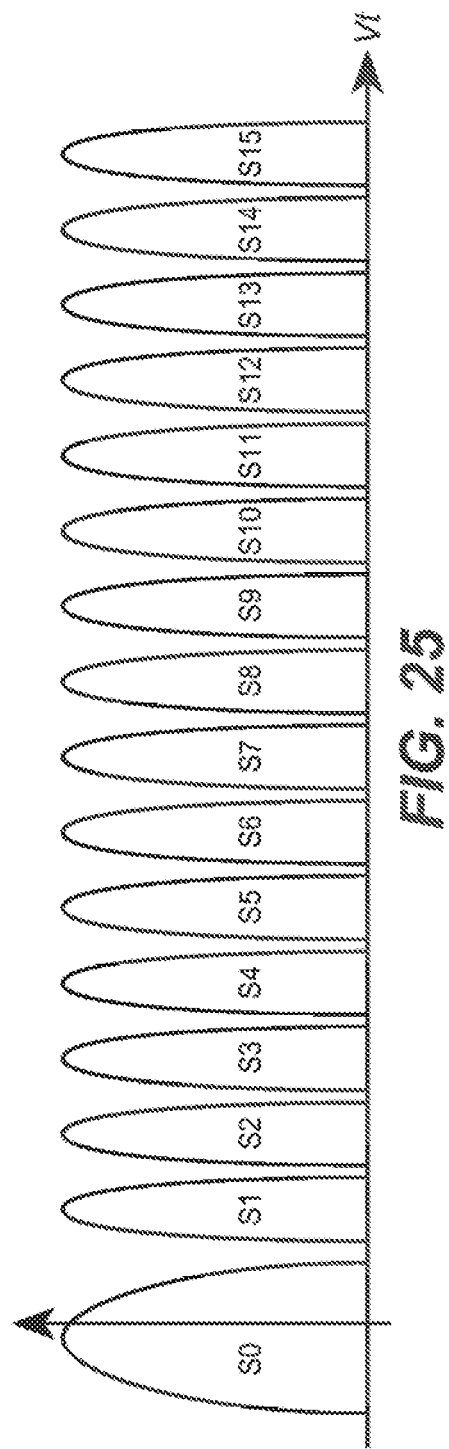
FIG. 25 is a state diagram for a fully programmed four-bit per cell word line.
Figure 26:
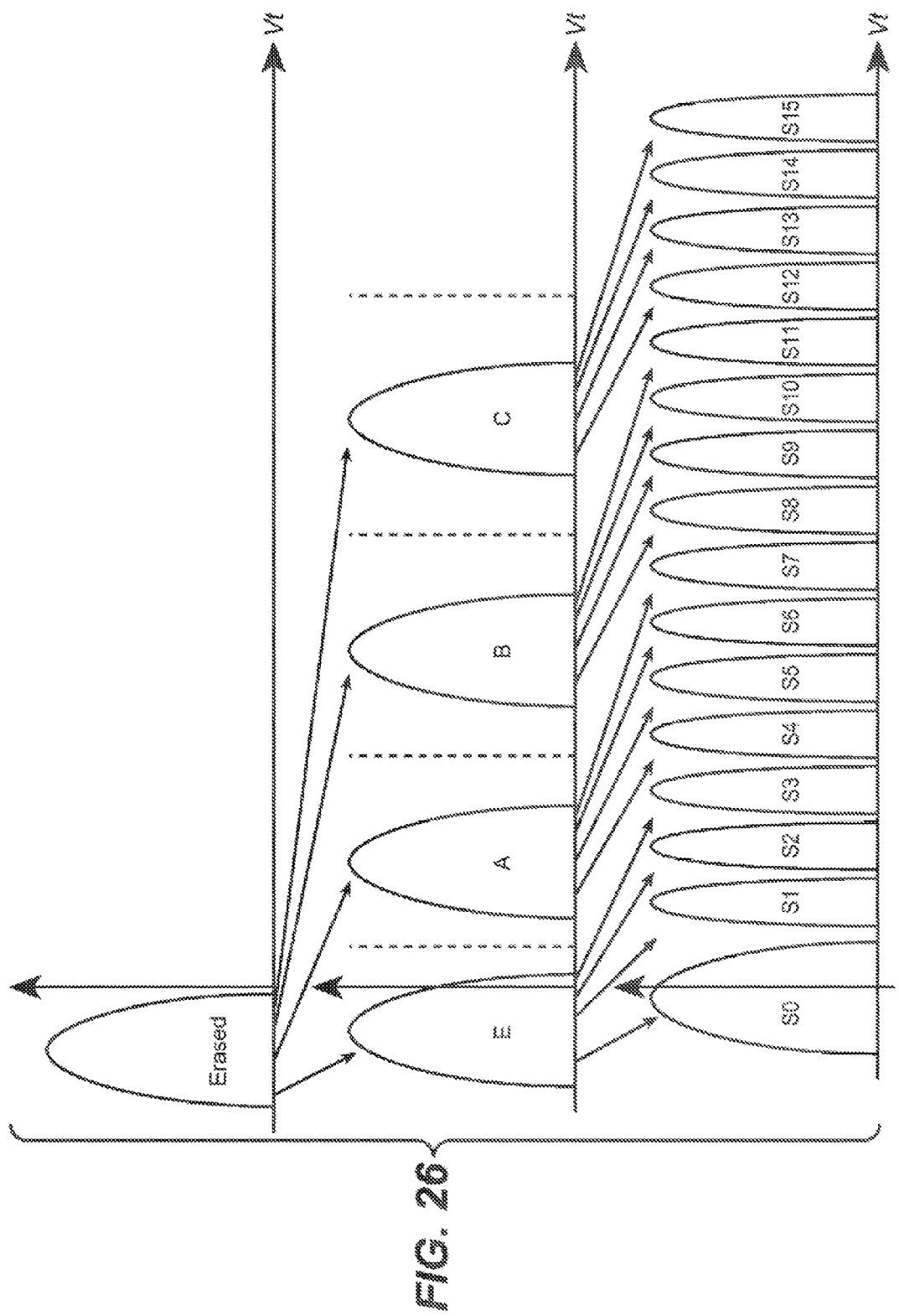
FIG. 26 illustrates a programming process where a word line is initially written with two-bits per cell and then written with two more bits per cell.

The following discussion uses a four bit per cell, or X4, arrangement, where four pages of data are stored on a word line. Starting from an erased state, as is FIG. 7B, a fully programmed X4 would line would have states S0-S15 as shown FIG. 25. A word line can be written in a full sequence programming operation from the erased state to the full 16 (in this example) states, or first be programmed in one or more intermediate set of states. This sort of intermediate programming can be done for various reasons, such as to increase write speed when using the intermediate state or to simplify latch or other peripheral structures. FIG. 26 illustrates an example where, starting from the erased state at top, then programmed in a first pass into a 2-bit per cell (X2), 2 page per word line format as shown at center, where the states are E, A, B, C. A second programming pass for the word line then resolves each of the four intermediate states into four final states, as shown at bottom.

In the following, the discussion is presented in the context of 4-bit per cell (X4) memory operation in which, if initially written to an intermediate state, a word line is first programmed as X2 memory. More generally, the arrangement can be extended to other number of multi-states and other numbers of intermediate states. The techniques can be applied to both 2D and 3D NAND type multi-state memories, although when a specific embodiment needs to be referenced a BiCS type 3D structure will be used.

In the example where word lines are first written in an X2 pass, then in an X4 pass, the first two pages of data will referred to as the lower page (LP) and upper page (UP). The pages of the second pass will be called the middle page (MP) and top page. The following looks at two sequences for writing first to X2 then to X4: where all word lines of a block are written sequentially to X2, then written sequentially to X4; and where each word line is first written to X2 then to X4 before moving on to the next word line of the sequence. In the first case, an example of an X2 open block is shown in Table 3, where the first five word lines have written with two pages of data and the rest are still erased.

TABLE 3

Open block X2

| WL | LP | UP | MP | Top |
|---|---|---|---|---|
| 0 | 0 | 1 | | |
| 1 | 2 | 3 | | |
| 2 | 4 | 5 | | |
| 3 | 6 | 7 | | |
| 4 | 8 | 9 | | |
| 5 | 10 | 11 | | |
| 6 | | | | |
| . | | | | |
| . | | | | |
| 256 | . | . | | |

In a situation like that of Table 3, a scan can start with finding the first erased word line (word line 6 in the example), where this can be done using a binary search or one of the search techniques described above. For example, the search can be performed by controller firmware. The preceding, last written word line (WL 5 here) is then read for the highest, C state and checked for ECC to see if X2 programming has completed. To avoid false triggering, the reads can be made using a dynamic read approach, where the read point is shifted to account for operating conditions or to allow a more relaxed read margin.

For an open block with respect to X4 programming, there are two cases considered here depending on programming order. In one case, each word line in the write sequence is fully X4 programmed before moving on to the next word line. In the other case, the block is fully programmed in X2 mode prior to beginning the X2→X4 programming sequence.

If the programming order is such that the entire block is programmed in X2 mode first before going back to the first word line to continue programming to the X4 states on top of the X2 states, then the open block would look something like that shown in Table 4.

TABLE 4

X4 open block with full block X2

| String page | LP | UP | MP | Top | |
|---|---|---|---|---|---|
| 0 | 0 | 1 | 512 | 513 | |
| 1 | 2 | 3 | 514 | 515 | |
| 2 | 4 | 5 | 516 | 517 | |
| 3 | 6 | 7 | 518 | 519 | |
| 4 | 8 | 9 | 520 | 521 | |
| 5 | 10 | 11 | 522 | 523 | X2 complete/X4 abort check |
| . | . | . | | | |
| . | . | . | | | |
| 256 | 510 | 511 | | | |

Figure 27:
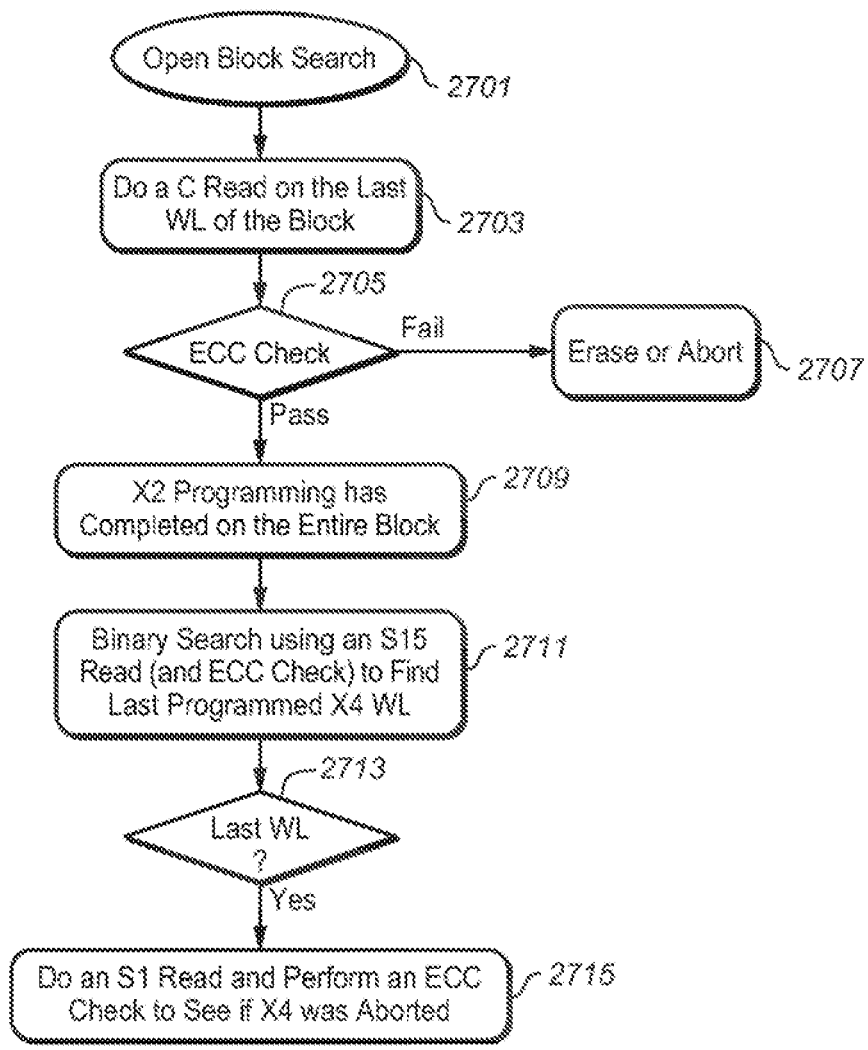
FIG. 27 is a flow for a scan to check an open X4 block for programming abort, when the block is first X2 programmed.

FIG. 27 is a flow for a scan to check for X4 abort in this case, with the open block search beginning at 2701. If it is not established, such as through a flag, the block is X2 closed, the flow can start by finding the first erased page by a binary or other search, as described above. Alternately, or in addition, at 2703 the last word line in the block's write sequence (WL256 in the example) can be read for the highest intermediate programming state (C state in the example) and then checked for ECC at 2705 to see if X2 programming has completed on the entire block. This read can again be done as a dynamic read to avoid false fails. If the ECC check fails (2707), then the last word line is either still erased or the X2 write on this word line aborted. If the word line passes (2709) the C state read, then the intermediate programming has completed on the whole of the block.

If the intermediate, X2 programming is completed, that at 2711 a search is performed to determine the last X4 programmed word line. This can be performed using a binary search or an adaptation of the other search methods described above search using a highest state (S15) read and check for ECC to see up until which word line the X4 states have been programmed, where again a dynamic read can be used to avoid false triggers. Once the last written X4 WL is found at 2713, a lowest X4 state (S1) read and check for ECC is performed at 2715 on the next word line in the sequence to figure out if the X4 programming started but got aborted. For example, if, as shown in the Table 4, it is found that WL5 is the last word line to read at the S15 level, then word line WL6 is checked to see whether X4 programming has started, but was aborted. Again, the S1 read can use a dynamic read.

If, instead, the programming order is such that the X4 states are programmed on top of the X2 states on a word line by word line basis, then an open block would look something like what is shown in Table 5.

TABLE 5

X4 open block - WL by WL X4 transition

| WL | LP | UP | MP | Top | |
|---|---|---|---|---|---|
| 0 | 0 | 1 | 2 | 3 | |
| 1 | 4 | 5 | 6 | 7 | |
| 2 | 8 | 9 | 10 | 11 | X2/X4 Abort check |
| 3 | | | | | |
| 4 | | | | | |
| 5 | | | | | |
| . | | | | | |
| . | | | | | |
| 127 | . | . | | | |

Figure 28:
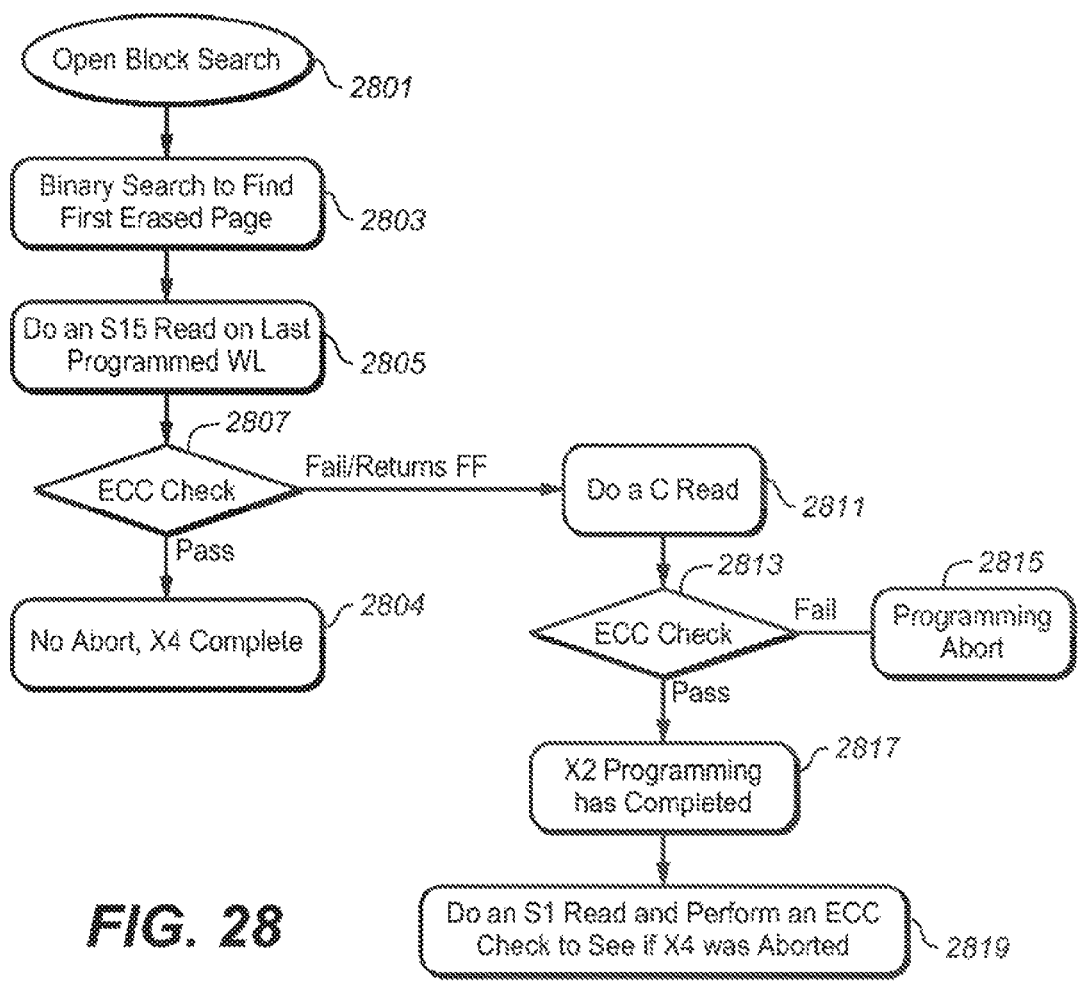
FIG. 28 is a flow for a scan to check an open X4 block for programming abort, when a block is X4 programmed on a word line by word line basis.

FIG. 28 is flow for determining read abort when the each word line in the sequence is written will all pages before moving on to the next, starting at 2801. At 2803, a binary or other search, such as described in earlier sections, is performed to find the first erased page (WL3 in the example of Table 5). On the last programmed word line (WL2 in the example), a highest state (S15) read is performed (2805) and checked for ECC (2807) to see if X4 programming is complete, where again dynamic read can be used. If the word line passes the ECC check (2809), then there was no abort and the full write completed. If, instead, the read fails (returns all returns all FF) and the write algorithm first performs an intermediate programming, this is checked for completion at 2811-2817; if instead the algorithm goes straight to X4, the flow can skip to 2819.

For exemplary X4 over X2 example, if the X4 write has not completed, the (same) word line is checked see if the X2 write has completed by doing a C-read, that can use dynamic read, at 2811 and checking for ECC at 2813 to see if X2 programming has completed. In case of a fail (2815), then the programming suffered an abort. The programming abort could be from X2 or X4: If the C-state read fails the ECC check and the number of cells is less than one-fourth of the total, then this indicates the case of an X2-abort; however, if the number of cells is much higher than one-fourth of the total number (say one-third or higher), then this indicates the case of an X4-abort. A pass at 2813 indicates that the X2 program completed (2819) and the (same) word line is then checked to see whether the X4 write phase began, but did not complete. (Note that in this process the reads at 2805, 2811, and 2819 are all for the same word line, such as WL2 in the example of Table 5.) The read to determine whether X4 programming began is performed for the lowest X4 level above erased (S1) and can use dynamic read.

CONCLUSION

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principals involved and its practical application, to thereby enable others to best utilize the various embodiments and with various modifications as are suited to the particular use contemplated. It is intended that the scope be defined by the claims appended hereto.

It is claimed:

1. A method, comprising:
performing a search operation in a block of a nonvolatile memory for finding a last written word line, the nonvolatile memory comprising a plurality of memory cells and a plurality of word lines connected between a first end of the block and a second end of the block, each of the plurality of memory cells connected to one of the plurality of word lines, wherein the search operation comprises:
applying a first bias voltage to a first portion of the plurality of word lines;
applying a second bias voltage to a selected one of the plurality of word lines;
applying a third bias voltage to a second portion of the plurality of word lines; and
varying the first portion of the plurality of word lines, the second portion of the plurality of word lines, and the selected one of the plurality of word lines based upon a predetermined threshold until the last written word line is identified;
wherein the selected one of the plurality of word lines is located between the first portion of the plurality of word lines and the second portion of the plurality of word lines; and
wherein the third bias voltage is less than the first bias voltage.

2. The method of claim 1, further comprising setting the first bias voltage to a voltage level at which all of the plurality of memory cells connected to the first portion of the plurality of word lines are conducting.

3. The method of claim 2, wherein the voltage level is higher than a highest threshold voltage at which the plurality of memory cells connected to the first portion of the plurality of word lines conduct.

4. The method of claim 1, further comprising setting the second bias voltage to correspond to a sensing voltage of a memory cell of the plurality of memory cells that is connected to the selected one of the plurality of word lines.

5. The method of claim 1, further comprising setting the third bias voltage to correspond to a voltage level that causes an erased memory cell of the plurality of memory cells to conduct.

6. The method of claim 1, further comprising:
determining a number of the plurality of memory cells that are in the second portion of the plurality of word lines and that are conducting;
comparing the number with the predetermined threshold; and
varying the first portion of the plurality of word lines, the second portion of the plurality of word lines, and the selected one of the plurality of word lines by a first increment if the number is equal to or greater than the predetermined threshold and by a second increment if the number is less than the predetermined threshold.

7. The method of claim 6, wherein varying the first portion of the plurality of word lines, the second portion of the plurality of word lines, and the selected one of the plurality of word lines with the first increment comprises applying the second bias voltage to another selected word line of the plurality of word lines that is separated from the selected one of the plurality of word lines by the first increment;
wherein the first portion of the plurality of word lines changes to a group of the plurality of word lines extending from the another selected word line to the first end; and
wherein the second portion of the plurality of word lines changes to another group of the plurality of word lines extending from the another selected word line to the second end.

8. The method of claim 7, wherein the first increment is either eight or four.

9. The method of claim 6, wherein varying the first portion of the plurality of word lines, the second portion of the plurality of word lines, and the selected one of the plurality of word lines with the second increment comprises applying the second bias voltage to another selected word line of the plurality of word lines that is separated from the selected one of the plurality of word lines by the second increment;
wherein the first portion of the plurality of word lines changes to a group of the plurality of word lines extending from the another selected word line to the first end; and wherein the second portion of the plurality of word lines changes to another group of the plurality of word lines extending from the another selected word line to the second end.

10. The method of claim 9, wherein the second increment is either four or one.

11. The method of claim 1, wherein the first end is a source end and the second end is a drain end, and wherein the plurality of memory cells are programmed sequentially from the source end to the drain end such that the second portion of the plurality of word lines comprises the plurality of word lines extending between the selected one of the plurality of word lines and the drain end and the first portion of the plurality of word lines comprises the plurality of word lines extending between the selected one of the plurality of word lines and the source end, and wherein the plurality of memory cells connected to the second portion of the plurality of word lines are designated to be programmed after the plurality of memory cells connected to the first portion of the plurality of word lines.

12. The method of claim 1, wherein the first end is a source end and the second end is a drain end, and wherein the plurality of memory cells are programmed sequentially from the drain end to the source end such that the second portion of the plurality of word lines comprises the plurality of word lines extending between the selected one of the plurality of word lines and the source end and the first portion of the plurality of word lines comprises the plurality of word lines extending between the selected one of the plurality of word lines and the drain end, wherein the plurality of memory cells connected to the second portion of the plurality of word lines are designated to be programmed after the plurality of memory cells connected to the first portion of the plurality of word lines.

13. A method, comprising:
performing a search operation on a block of a nonvolatile memory for finding a last written page of the block, the block comprising a plurality of memory cells and a plurality of word lines, each of the plurality of memory cells connected to one of the plurality of word lines, wherein the plurality of memory cells are programmed sequentially and the search operation for finding the last written page of the block comprises:
applying a first bias voltage to a first portion of the plurality of word lines;
applying a second bias voltage to a selected one of the plurality of word lines;
applying a third bias voltage to a second portion of the plurality of word lines;
comparing a number of the plurality of memory cells connected to the first portion of the word lines that are conducting with a pre-determined threshold;
changing the selected one of the plurality of word lines, the first portion of the plurality of word lines, and the second portion of the plurality of word lines by a first increment based upon the number being equal to or greater than the predetermined threshold;
changing the selected one of the plurality of word lines, the first portion of the plurality of word lines, and the second portion of the plurality of word lines by a second increment based upon the number being less than the predetermined threshold;

wherein the plurality of memory cells connected to the second portion of the plurality of word lines are designated to be programmed after the plurality of memory cells connected to the first portion of the plurality of word lines;
wherein the selected one of the plurality of word lines is located between the first portion of the plurality of word lines and the second portion of the plurality of word lines; and
wherein the third bias voltage corresponds to a voltage level that causes the plurality of memory cells in an erase condition to conduct.

14. The method of claim 13, wherein the third bias voltage is less than the first bias voltage.

15. A method comprising:
dividing a plurality of word lines of a nonvolatile memory into a plurality of zones, wherein each of the plurality of word lines is connected to a memory cell, and wherein each of the plurality of zones comprises a sequential group of the plurality of word lines;
applying a first bias voltage to a first portion of the plurality of zones;
applying a second bias voltage to a second portion of the plurality of zones, wherein the first bias voltage is less than the second bias voltage;
identifying one of the plurality of zones from the first portion of the plurality of zones and the second portion of the plurality of zones having a last written word line, wherein the last written word line is part of the plurality of word lines;
dividing the one of the plurality of zones having the last written word line into a plurality of sub-zones; and
identifying one of the plurality of sub-zones having the last written word line by applying the first bias voltage to a first portion of the plurality of sub-zones and the second bias voltage to a second portion of the plurality of sub-zones.

16. The method of claim 15, further comprising dividing the one of the plurality of sub-zones having the last written word into additional smaller sub-zones until the last written word line is identified.

17. The method of claim 15, wherein the first bias voltage is a voltage level that causes an erased one of the plurality of memory cells to conduct.

18. The method of claim 15, further comprising:
identifying if all of the plurality of memory cells lying within the first portion of the plurality of zones are conducting; and
identifying a zone from the second portion of the plurality of zones that is located next to first portion of the plurality of zones as having the last written word line.

19. The method of claim 15, further comprising:
identifying at least one memory cell from the plurality of memory cells in the first portion of the plurality of zones that is not conducting; and
identifying a zone of the first portion of the plurality of zones in which the at least one memory cell that is not conducting is located as having the last written word line.

20. The method of claim 15, wherein the plurality of zones comprises four zones.

* * * * *